United States Patent
Kang et al.

(10) Patent No.: US 11,509,295 B2
(45) Date of Patent: Nov. 22, 2022

(54) HIGH-SPEED FLIP FLOP CIRCUIT INCLUDING DELAY CIRCUIT

(71) Applicant: Samsung Electronics Co., Ltd., Suwon-si (KR)

(72) Inventors: Byounggon Kang, Seoul (KR); Changbeom Kim, Tongyeong-si (KR); Dalhee Lee, Seoul (KR); Wookyu Kim, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/340,215

(22) Filed: Jun. 7, 2021

(65) Prior Publication Data

US 2021/0409009 A1   Dec. 30, 2021

(30) Foreign Application Priority Data

Jun. 24, 2020 (KR) .................. 10-2020-0077384
Jun. 24, 2020 (KR) .................. 10-2020-0077385
Jan. 7, 2021 (KR) .................. 10-2021-0002210

(51) Int. Cl.
*H03K 3/037* (2006.01)
*G01R 31/3177* (2006.01)
*H03K 3/3562* (2006.01)

(52) U.S. Cl.
CPC ....... *H03K 3/0372* (2013.01); *G01R 31/3177* (2013.01); *H03K 3/3562* (2013.01)

(58) Field of Classification Search
CPC .............. H03K 3/0372; H03K 3/3562; H03K 3/35625; G01R 31/318541
See application file for complete search history.

(56) References Cited

U.S. PATENT DOCUMENTS

| | | |
|---|---|---|
| 6,614,276 B2 | 9/2003 | Robertson et al. |
| 7,117,412 B2 | 10/2006 | Ogawa et al. |
| 7,154,319 B2 | 12/2006 | Kim |
| 7,345,519 B2 * | 3/2008 | Hirata ............... H03K 3/012 326/98 |
| 8,339,172 B2 | 12/2012 | Firmin et al. |
| 9,035,686 B1 | 5/2015 | Hsu et al. |
| 9,350,327 B2 | 5/2016 | Nandi et al. |
| 10,326,430 B2 | 6/2019 | Lai et al. |
| 10,651,850 B2 | 5/2020 | Mittal et al. |
| 10,686,428 B2 | 6/2020 | Guo et al. |
| 2014/0266365 A1 | 9/2014 | Penzes et al. |
| 2018/0115306 A1 | 4/2018 | Saha et al. |
| 2019/0319612 A1 | 10/2019 | Nandi et al. |

FOREIGN PATENT DOCUMENTS

KR    100612417 B1    8/2006

* cited by examiner

*Primary Examiner* — Patrick O Neill
(74) *Attorney, Agent, or Firm* — Muir Patent Law, PLLC

(57) ABSTRACT

A flip flop includes a master latch and a slave latch. The master latch includes a delay circuit configured to receive a clock signal and generate a first internal signal, and is configured to generate an internal output signal by latching a data signal based on the first internal signal. The slave latch is configured to generate a final signal by latching the internal output signal. The delay circuit is further configured to generate the first internal signal by delaying the clock signal by a delay time when the clock signal has a first logic level and generate the first internal signal based on the data signal when the clock signal has a second logic level.

20 Claims, 26 Drawing Sheets

HIGH-SPEED FLIP FLOP CIRCUIT INCLUDING DELAY CIRCUIT

CROSS-REFERENCE TO RELATED APPLICATIONS

This application is based on and claims priority under 35 U.S.C. § 119 to Korean Patent Application Nos. 10-2020-0077384 and 10-2020-0077385, filed on Jun. 24, 2020, and 10-2021-0002210, filed on Jan. 7, 2021, in the Korean Intellectual Property Office, the disclosures of which are incorporated by reference herein in their entirety.

BACKGROUND

The present disclosure relates to a flip flop circuit, and more particularly, to a high-speed flip flop circuit including a delay circuit.

Along with the high performance and high integration of semiconductor integrated circuits, the number of flip flops included in a semiconductor integrated circuit is increasing. Flip flops are used as data storage elements, and these data storage elements are used to store a state. A flip flop is an electronic circuit capable of storing and maintaining one-bit information and is a basic element of a sequential logic circuit. Because a flip flop may transfer data in response to an active edge of a clock signal, a frequency of the clock signal used as a measure indicating the performance of a semiconductor integrated circuit is important.

SUMMARY

The present disclosure relates to a high-speed flip flop circuit including a delay circuit and provides a flip flop circuit capable of increasing a frequency of a clock signal by latching a data signal in response to a first internal signal.

According to an aspect of the inventive concept, there is provided a flip flop including: a master latch including a delay circuit configured to receive a clock signal and generate a first internal signal, and the master circuit configured to generate an internal output signal by latching a data signal based on the first internal signal; and a slave latch configured to generate a final signal by latching the internal output signal, wherein the delay circuit is further configured to generate the first internal signal by delaying the clock signal by a delay time when the clock signal has a first logic level and generate the first internal signal based on the data signal when the clock signal has a second logic level.

According to another aspect of the inventive concept, there is provided a flip flop including: a first latch configured to receive a data signal and a clock signal and output an internal output signal; and a second latch configured to output a final signal by latching the internal output signal in response to the clock signal, wherein the first latch includes a delay circuit configured to generate a first internal signal by delaying the internal output signal by a delay time. The first latch is further configured to generate the internal output signal by latching the data signal in response to the first internal signal.

According to another aspect of the inventive concept, there is provided a flip flop including: a first OR-AND-inverter (OAI)21 logic circuit configured to receive a scan input signal, an inverted scan enable signal, and an inverted clock signal and output an intermediate signal; a second OAI21 logic circuit configured to receive an inverted internal output signal, the inverted clock signal, and the intermediate signal and output a first internal signal; an OAI31 logic circuit configured to receive a second internal signal, a scan enable signal, a data signal, and the first internal signal and output an internal output signal; a NOR2 logic circuit configured to receive the inverted clock signal and the internal output signal and output the second internal signal; an AND-OR-inverter (AOI)21 logic circuit configured to receive an inverted signal, the inverted clock signal, and the second internal signal and output an inverted final signal; a first inverter configured to output the inverted signal by inverting the inverted final signal; and a second inverter configured to generate a final signal by inverting the inverted final signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, various embodiments of the present disclosure will be described with reference to the accompanying drawings.

Figure 1:
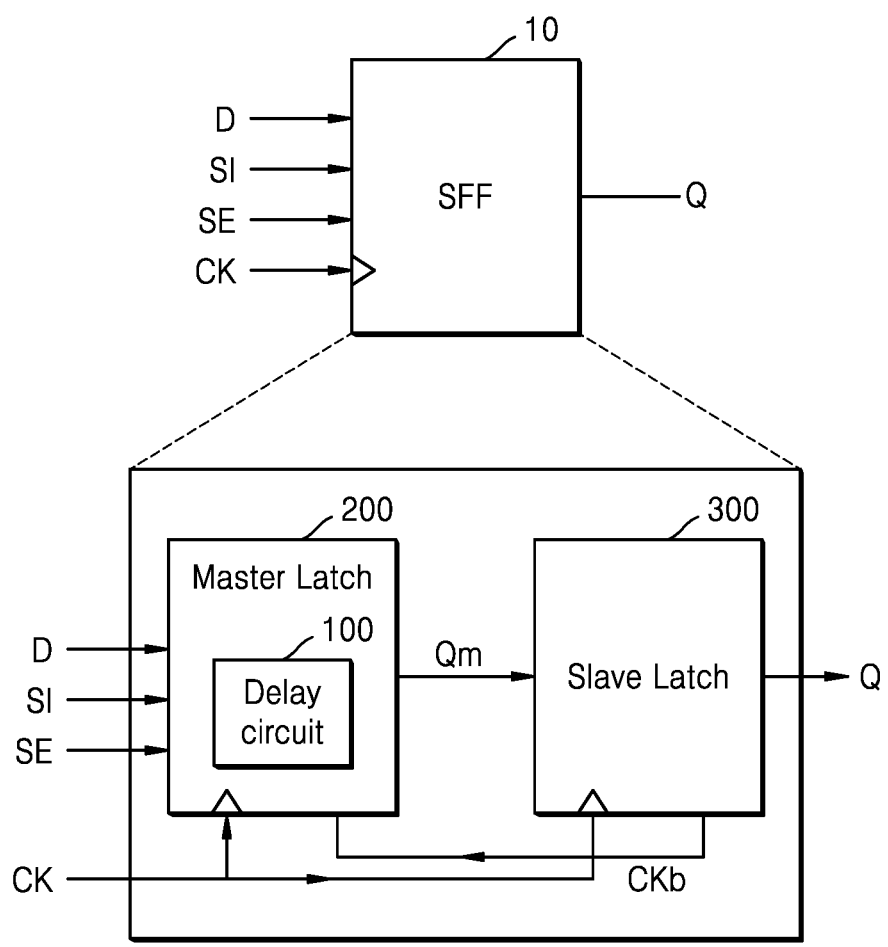
FIG. 1 is a block diagram of a flip flop according to an example embodiment of the inventive concept.

FIG. 1 is a block diagram of a flip flop (or, a flip flop circuit) 10 according to an example embodiment of the inventive concept. Referring to FIG. 1, the flip flop 10 according to an example embodiment of the inventive concept may be a scan flip flop configured to receive a data signal D or a scan input signal SI and a scan enable signal SE and output a final signal (or, final output signal) Q in response to a clock signal CK.

The scan enable signal SE may indicate a first operation mode or a second operation mode according to a logic level of the scan enable signal SE. For example, when the scan enable signal SE has a first logic level (e.g., a logic low level), the scan enable signal SE may indicate the first operation mode, and when the scan enable signal SE has a second logic level (e.g., a logic high level), the scan enable signal SE may indicate the second operation mode. Herein, the logic level may mean a logic low level (e.g., '0') or a logic high level (e.g., '1'). Further, the logic level may mean a voltage level. For example, the first operation mode may be a normal operation mode in which data is transferred, and the second operation mode may be a scan test mode in which a test operation is performed. However, this is merely an embodiment of the inventive concept, and in some embodiments, the first operation mode may be the scan test mode, and the second operation mode may be the normal operation mode.

When the scan enable signal SE indicates the normal operation mode, the flip flop 10 may perform a normal operation of providing the final signal Q by latching the data signal D. When the scan enable signal SE indicates the scan test mode, the flip flop 10 may perform a scan test operation of providing the final signal Q by latching the scan input signal SI.

The flip flop 10 according to an example embodiment of the inventive concept may include a master latch 200 and a slave latch 300. The master latch 200 may receive the data signal D or the scan input signal SI, in response to the scan enable signal SE, and output an internal output signal Qm. The slave latch 300 may receive the internal output signal Qm and output the final signal Q.

The master latch 200 according to an example embodiment of the inventive concept may include a delay circuit 100. As described below with reference to FIG. 3, the delay circuit 100 may receive the clock signal CK and output a first internal signal DCK. The master latch 200 may ensure a reduced setup time to latch the data signal D, by latching the data signal D based on the first internal signal DCK. The setup time may indicate a minimum time for which a value of the data signal D is supposed to be constantly maintained before an active edge of the clock signal CK, so as to output the data signal D as the final signal Q.

The slave latch 300 may receive the clock signal CK and output a second internal signal CKb indicating an inverted value of the clock signal CK. For example, as described below with reference to FIG. 14A, when the clock signal CK has the logic low level, the second internal signal CKb may have the logic high level. The second internal signal CKb may be a signal generated at an internal node of the slave latch 300. The flip flop 10 according to an example embodiment of the inventive concept may ensure the second internal signal CKb from the internal node of the slave latch 300 without including a separate clock inverter configured to invert the clock signal CK, thereby saving power to be consumed by the clock inverter.

Figure 2:
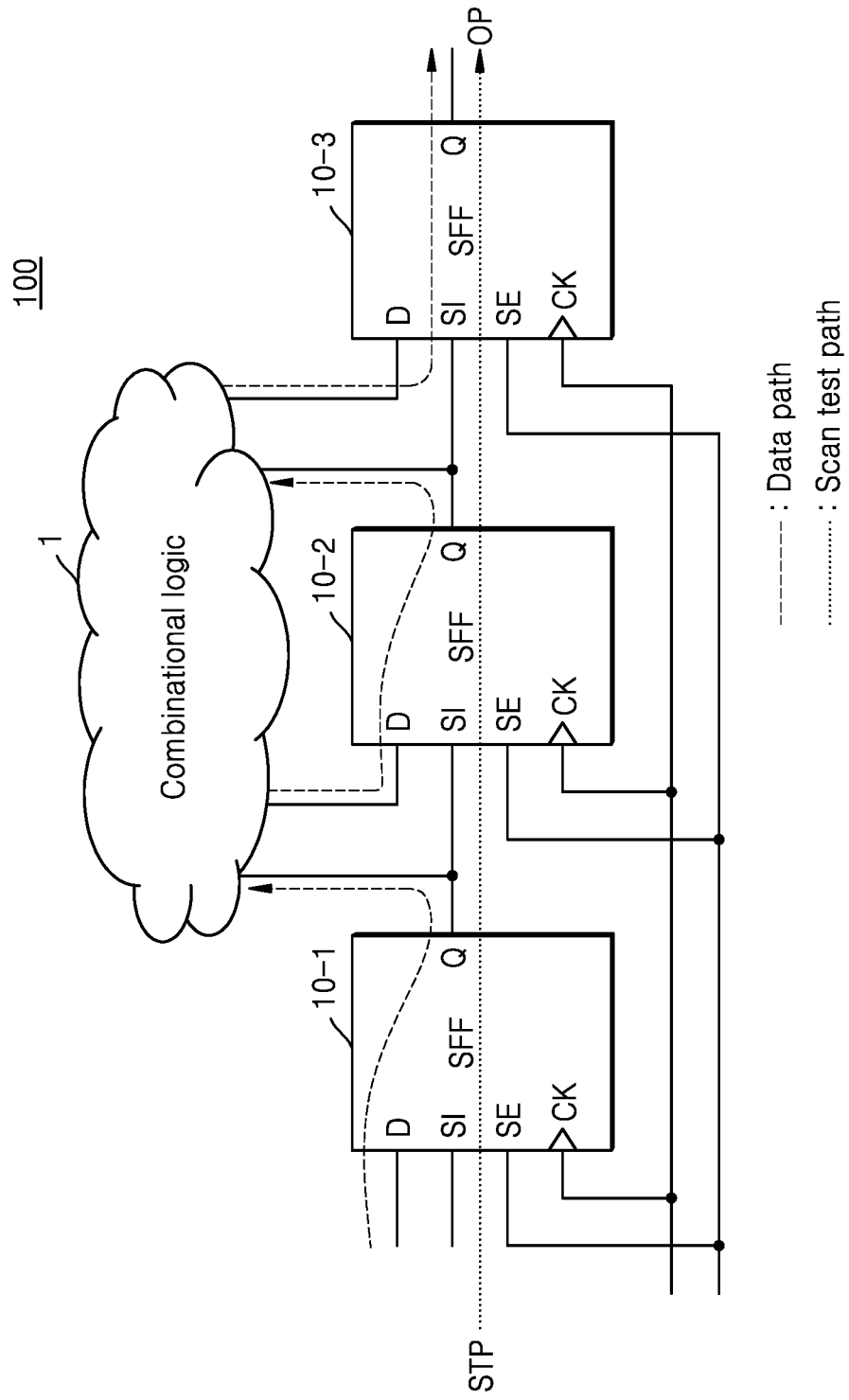
FIG. 2 is a diagram for describing an integrated circuit operating in a normal operation mode and a scan test mode.

FIG. 2 is a diagram for describing an integrated circuit 100 operating in the normal operation mode and the scan test mode. Referring to FIG. 2, the integrated circuit 100 may include a combinational logic circuit 1 and a plurality of scan flip flops 10-1, 10-2, and 10-3. The combinational logic circuit 1 may output the same output data with respect to the same input data. The plurality of scan flip flops 10-1, 10-2, and 10-3 may be a sequential logic circuit. The sequential logic circuit may include a memory element. The sequential logic circuit may output different output data according to a memory state although the same input data is input.

When the scan enable signal SE indicates the normal operation mode, data may be transferred along a data path, and an original function of the integrated circuit 100 may be performed. When the scan enable signal SE indicates the scan test mode, data may be transferred along a scan test path, thereby performing a scan test operation. In the scan test operation, an error occurring in the sequential logic circuit may be checked by comparing a scan test pattern STP to an output pattern OP. The scan test pattern STP may be an input bit stream, and the output pattern OP may be an output bit stream corresponding to the scan test pattern STP.

Figure 3:
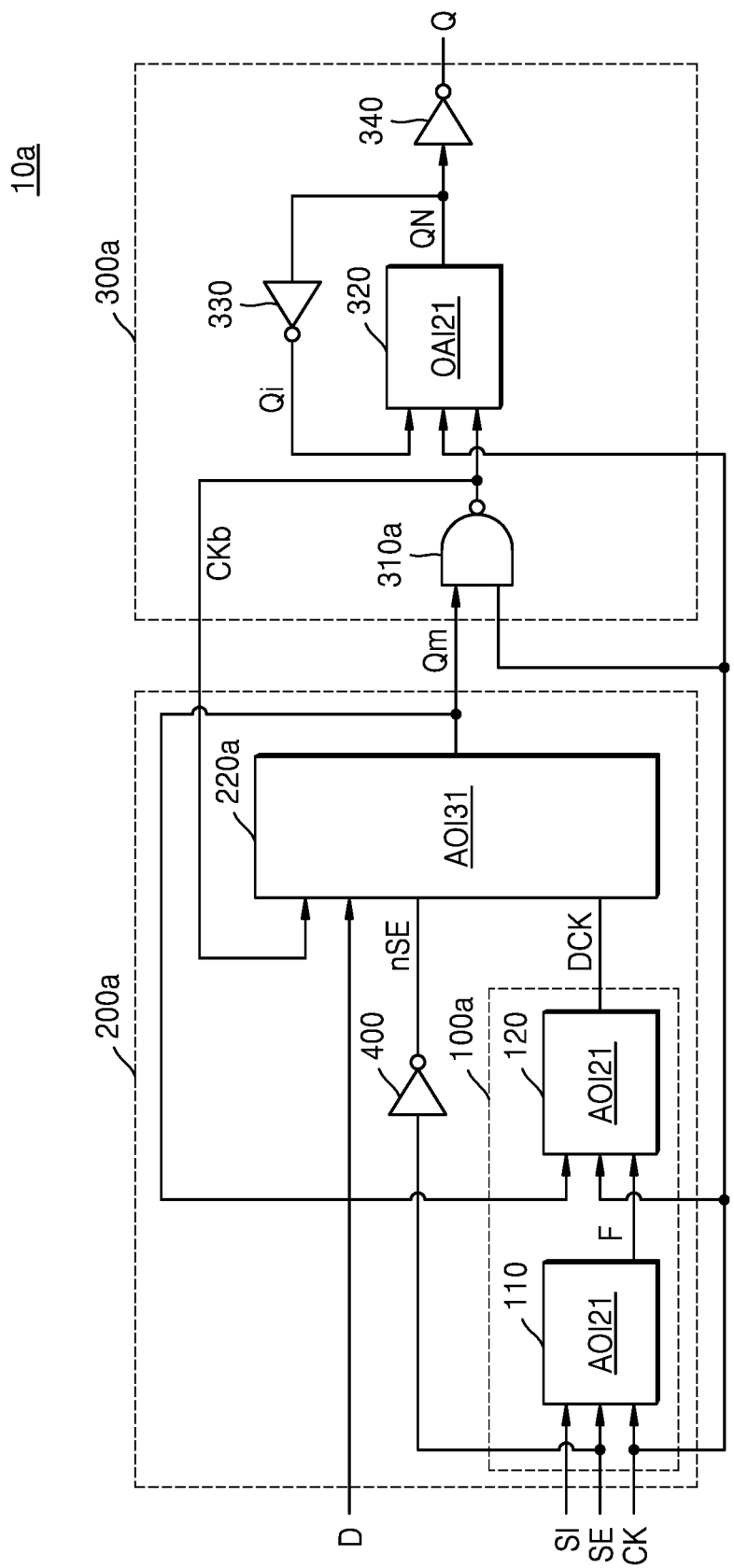
FIG. 3 is a block diagram of a flip flop according to an example embodiment of the inventive concept.
Figure 4:
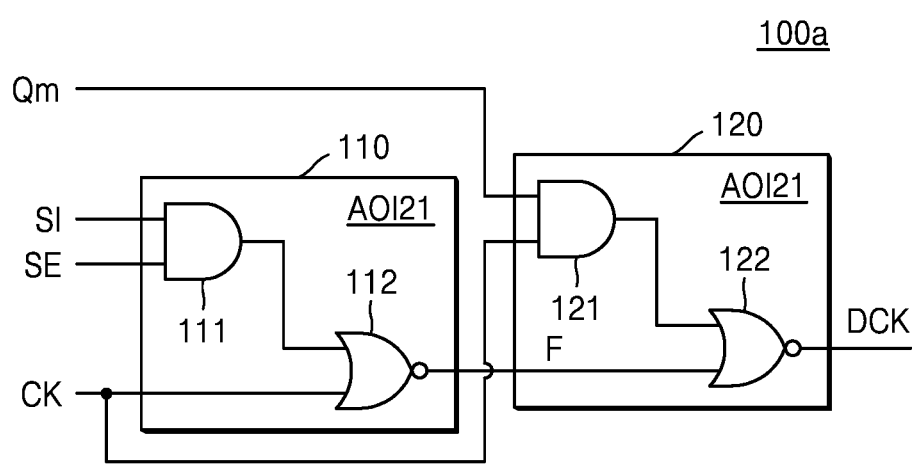
FIG. 4 is a circuit diagram of a delay circuit according to an example embodiment of the inventive concept.
Figure 5:
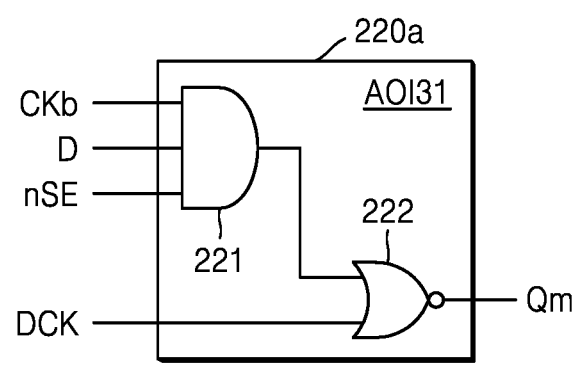
FIG. 5 is a circuit diagram of an AND-OR-inverter (AOI31) logic circuit according to an example embodiment of the inventive concept.

FIG. 3 is a block diagram of a flip flop 10a according to an example embodiment of the inventive concept. FIG. 4 is a circuit diagram of a delay circuit 100a according to an example embodiment of the inventive concept. FIG. 5 is a circuit diagram of an AOI31 logic circuit 220a according to an example embodiment of the inventive concept.

Referring to FIG. 3, the flip flop 10a may include a master latch 200a and a slave latch 300a. The master latch 200a may include the delay circuit 100a. The delay circuit 100a may receive the scan input signal SI, the scan enable signal SE, the clock signal CK, and the internal output signal Qm that is an output signal of the master latch 200a, and output the first internal signal DCK.

The delay circuit 100a may include two AND-OR-inverter (AOI)21 logic circuits, e.g., first and second AOI21 logic circuits 110 and 120. An AOI21 logic circuit may include an AND gate configured to receive two signals as inputs, an OR gate configured to receive, as inputs, an output signal of the AND gate and another signal, and an inverter, which are sequentially connected.

For example, the first AOI21 logic circuit 110 may receive, as inputs, the scan input signal SI, the scan enable signal SE, and the clock signal CK and output an intermediate signal F. Referring to FIG. 4, in an example embodiment, the first AOI21 logic circuit 110 may include an AND gate 111 configured to receive, as inputs, the scan input signal SI and the scan enable signal SE. The first AOI21 logic circuit 110 may include a NOR gate 112 configured to receive, as inputs, an output signal of the AND gate 111 and the clock signal CK and output the intermediate signal F.

Referring to FIG. 3, the second AOI21 logic circuit 120 may receive, as inputs, the internal output signal Qm that is the output signal of the master latch 200a, the clock signal CK, and the intermediate signal F and output the first internal signal DCK. Referring to FIG. 4, the second AOI21 logic circuit 120 may include an AND gate 121 configured to receive, as inputs, the internal output signal Qm and the clock signal CK. The second AOI21 logic circuit 120 may include a NOR gate 122 configured to receive, as inputs, an output signal of the AND gate 121 and the intermediate signal F and output the first internal signal DCK.

Referring to FIG. 3, the master latch 200a may include a first inverter 400. The first inverter 400 may receive, as an input, the scan enable signal SE and output an inverted scan enable signal nSE. However, the present embodiment is not limited thereto, and the first inverter 400 may be located outside the master latch 200a.

The master latch 200a may include an AOI31 logic circuit 220a. In an example embodiment, the AOI31 logic circuit may include an AND gate configured to receive three signals as inputs, an OR gate configured to receive, as inputs, an output signal of the AND gate and another signal, and an inverter, which are sequentially connected.

The AOI31 logic circuit 220a may receive, as inputs, the second internal signal CKb output from the slave latch 300a, the data signal D, the inverted scan enable signal nSE, and the first internal signal DCK and output the internal output signal Qm. Referring to FIG. 5, in an example embodiment, the AOI31 logic circuit 220a may include an AND gate 221 configured to receive, as inputs, the second internal signal CKb, the data signal D, and the inverted scan enable signal nSE. The AOI31 logic circuit 220a may include a NOR gate 222 configured to receive, as inputs, an output signal of the AND gate 221 and the first internal signal DCK and output the internal output signal Qm.

Referring to FIG. 3, the slave latch 300a may include a two-input NAND gate 310a. The two-input NAND gate 310a may receive, as inputs, the internal output signal Qm and the clock signal CK and output the second internal signal CKb. When the clock signal CK has the first logic level, the two-input NAND gate 310a may invert the second internal signal CKb from the first logic level to the second logic level. For example, when the clock signal CK has the logic low level, the second internal signal CKb may have the logic high level through the two-input NAND gate 310a. The flip flop 10a according to an example embodiment of the inventive concept may provide the second internal signal CKb by inverting a particular logic level of the clock signal CK even without including a clock inverter exclusively used to invert the clock signal CK. Therefore, power to be consumed by the clock inverter may be saved.

The slave latch 300a may include an OR-AND-inverter (OAI)21 logic circuit 320. In an example embodiment, an OAI21 logic circuit may include an OR gate configured to receive two signals as inputs, an AND gate configured to receive, as inputs, an output signal of the OR gate and another signal, and an inverter, which are sequentially connected. The OAI21 logic circuit 320 may receive an inverted signal Qi by inverting an output signal QN of the OAI21 logic circuit 320, the clock signal CK, and the second internal signal CKb and output the output signal QN.

The slave latch 300a may include a second inverter 330 and a third inverter 340. The second inverter 330 may receive the output signal QN and provide, to the OAI21 logic circuit 320, the inverted signal Qi by inverting the output signal QN. The third inverter 340 may receive the output signal QN and output the final signal Q by inverting the output signal QN.

Figure 6:
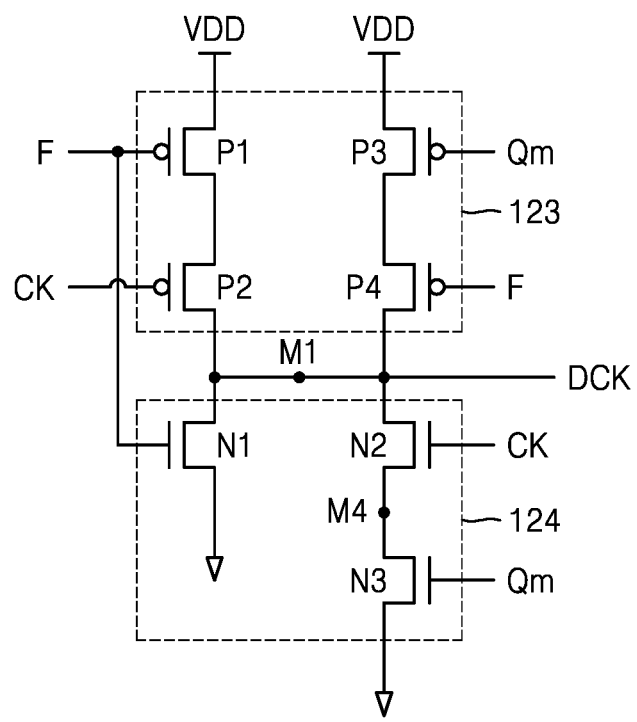
FIG. 6 is a circuit diagram of a second AOI21 logic circuit according to an example embodiment of the inventive concept.

FIG. 6 is a circuit diagram of the second AOI21 logic circuit 120 according to an example embodiment of the inventive concept. Referring to FIG. 6, the second AOI21 logic circuit 120 may include a pull-up circuit 123 and a pull-down circuit 124. The pull-up circuit 123 may generate the first internal signal DCK of the logic high level, and the pull-down circuit 124 may generate the first internal signal DCK of the logic low level.

In example embodiments, a transistor may include an active pattern. An active pattern may have, for example, a fin shape, and a transistor formed by an active pattern and a gate electrode may be referred to as a fin field effect transistor (FinFET). However, the present embodiment is not limited thereto, and the active pattern may include nanosheets. A transistor formed by nanosheets and a gate electrode may be referred to as a multi-bridge channel FET (MBCFET). In addition, a ForkFET having a structure in which an N-type transistor and a P-type transistor are relatively close to each other by separating nanosheets for the P-type transistor from nanosheets for the N-type transistor by a dielectric wall may be included. In addition, a cell may include a vertical FET (VFET) having a structure in which source/drain regions are separated from each other with a channel region therebetween, and a gate electrode surrounds the channel region. In addition, a transistor may be one of FETs such as a complementary FET (CFET), a negative capacitance FET (NCFET), and a carbon nanotube (CNT) FET. In the specification, a transistor may be one of a bipolar junction transistor and other three-dimensional transistors. In the specification, a P-type transistor may indicate a transistor formed in a P-type active region, and an N-type transistor may indicate a transistor formed in an N-type active region.

The pull-up circuit 123 may include a plurality of P-type transistors, e.g., first to fourth P-type transistors P1 to P4. The intermediate signal F may be input to a gate end of the first P-type transistor P1, the clock signal CK may be input to a gate end of the second P-type transistor P2, the internal output signal Qm may be input to a gate end of the third P-type transistor P3, and the intermediate signal F may be input to a gate end of the fourth P-type transistor P4.

The first P-type transistor P1 and the second P-type transistor P2 may be connected in series to form a series structure. For example, as shown in FIG. 6, a drain end of the first P-type transistor P1 may be connected to a source end of the second P-type transistor P2. However, the present embodiment is not limited thereto, and a source end of the first P-type transistor P1 may be connected to a drain end of the second P-type transistor P2. One end of the series structure may be connected to a power supply node VDD, and the other end of the series structure may be connected to a first node M1 at which the first internal signal DCK is output.

The third P-type transistor P3 and the fourth P-type transistor P4 may be connected in series to form a series structure. For example, as shown in FIG. 6, a drain end of the third P-type transistor P3 may be connected to a source end of the fourth P-type transistor P4. However, the present embodiment is not limited thereto, and a source end of the third P-type transistor P3 may be connected to a drain end of the fourth P-type transistor P4. One end of the series structure may be connected to the power supply node VDD, and the other end of the series structure may be connected to the first node M1.

The pull-down circuit 124 may include first to third N-type transistors N1 to N3. The intermediate signal F may be input to a gate end of the first N-type transistor N1, the clock signal CK may be input to a gate end of the second N-type transistor N2, and the internal output signal Qm may be input to a gate end of the third N-type transistor N3.

A source end of the first N-type transistor N1 may be connected to a ground node, and a drain end of the first N-type transistor N1 may be connected to the first node M1.

The second N-type transistor N2 and the third N-type transistor N3 may be connected in series to form a series structure. For example, as shown in FIG. 6, a source end of the second N-type transistor N2 may be connected to a drain end of the third N-type transistor N3. However, the present embodiment is not limited thereto, and a drain end of the second N-type transistor N2 may be connected to a source end of the third N-type transistor N3. One end of the series structure may be connected to the ground node, and the other end of the series structure may be connected to the first node M1.

The second AOI21 logic circuit 120 according to an example embodiment of the inventive concept may include the pull-up circuit 123 including the first and fourth P-type transistors P1 and P4 configured to receive the intermediate signal F, and thus, the series structure including the second P-type transistor P2 and the series structure including the third P-type transistor P3 may be connected to different power supply nodes, respectively. Therefore, a degree of routing freedom may be improved.

Figure 7A:
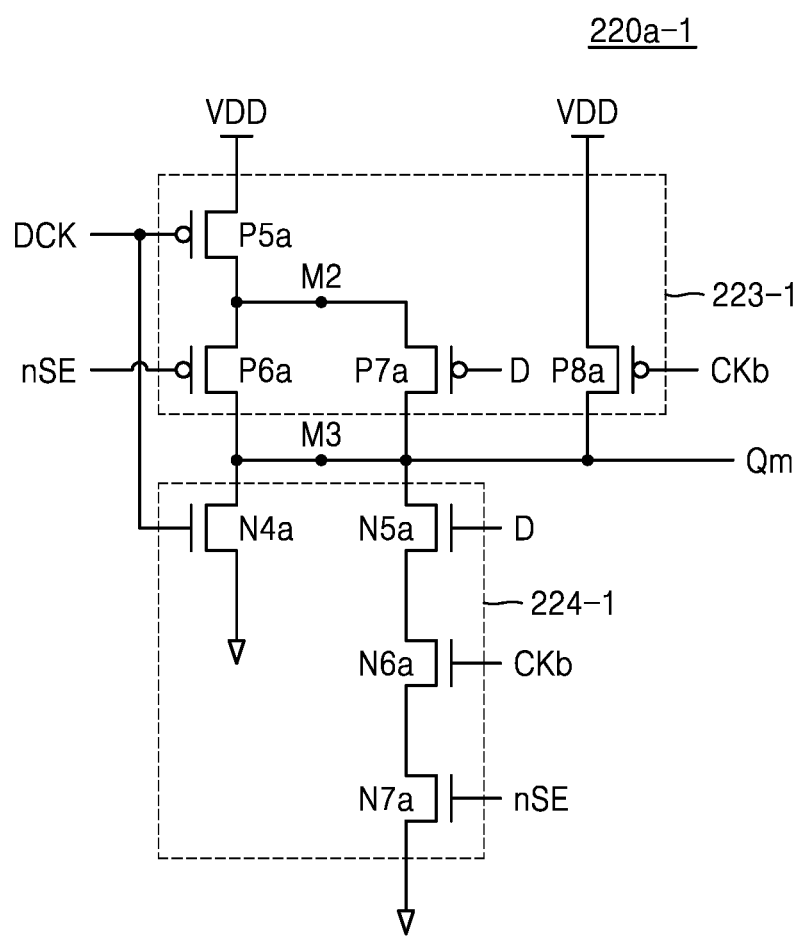
FIG. 7A is a circuit diagram of an AOI31 logic circuit according to an example embodiment of the inventive concept.

FIG. 7A is a circuit diagram of an AOI31 logic circuit 220a-1 according to an example embodiment of the inventive concept. Referring to FIG. 7A, the AOI31 logic circuit 220a-1 may include a pull-up circuit 223-1 and a pull-down circuit 224-1. The pull-up circuit 223-1 may generate the internal output signal Qm of the logic high level, and the pull-down circuit 224-1 may generate the internal output signal Qm of the logic low level.

The pull-up circuit 223-1 may include fifth to eighth P-type transistors P5a to P8a. The first internal signal DCK may be input to a gate end of the fifth P-type transistor P5a, a source end of the fifth P-type transistor P5a may be connected to the power supply node VDD, and a drain end of the fifth P-type transistor P5a may be connected to a second node M2. The inverted scan enable signal nSE may be input to a gate end of the sixth P-type transistor P6a, a source end of the sixth P-type transistor P6a may be connected to the second node M2, and a drain end of the sixth P-type transistor P6a may be connected to a third node M3. The data signal D may be input to a gate end of the seventh P-type transistor P7a, a source end of the seventh P-type transistor P7a may be connected to the second node M2, and a drain end of the seventh P-type transistor P7a may be connected to the third node M3. The second internal signal CKb may be input to a gate end of the eighth P-type transistor P8a, a source end of the eighth P-type transistor P8a may be connected to the power supply node VDD, and a drain end of the eighth P-type transistor P8a may be connected to the third node M3. The third node M3 may be a node at which the internal output signal Qm is output.

The pull-down circuit 224-1 may include fourth to seventh N-type transistors N4a to N7a. The first internal signal DCK may be input to a gate end of the fourth N-type transistor N4a. The data signal D may be input to a gate end of the fifth N-type transistor N5a. The second internal signal CKb may be input to a gate end of the sixth N-type transistor N6a. The inverted scan enable signal nSE may be input to a gate end of the seventh N-type transistor N7a. The fifth to seventh N-type transistors N5a to N7a may be connected in series to form a series structure. For example, as shown in FIG. 7A, a drain end of the fifth N-type transistor N5a may be connected to the third node M3, and a source end of the fifth N-type transistor N5a may be connected to a drain end of the sixth N-type transistor N6a. A source end of the sixth N-type transistor N6a may be connected to a drain end of the seventh N-type transistor N7a. A source end of the seventh N-type transistor N7a may be connected to the ground node. However, the present embodiment is not limited thereto, and there may be various sequences in which the fifth to seventh N-type transistors N5a to N7a are connected in series.

As described below with reference to FIGS. 13B and 14B, in a flip flop according to example embodiments of the inventive concept, when the clock signal CK has the logic high level, the first internal signal DCK and the second internal signal CKb may have the same logic level as the data signal D. Otherwise, as described below with reference to FIGS. 13A and 14A, when the clock signal CK has the logic low level, the first internal signal DCK may have the logic low level, and the second internal signal CKb may have the logic high level. For example, in the AOI31 logic circuit 220a-1, there may not be in a situation in which the first internal signal DCK has the logic high level and the second internal signal CKb has the logic low level. Accordingly, even when the source end of the eighth P-type transistor P8a is not connected to the second node M2, the AOI31 logic circuit 220a-1 may normally operate. Therefore, the source end of the eighth P-type transistor P8a may be connected to a separate power supply node, thereby increasing an overall degree of routing freedom of a flip flop.

Figure 7B:
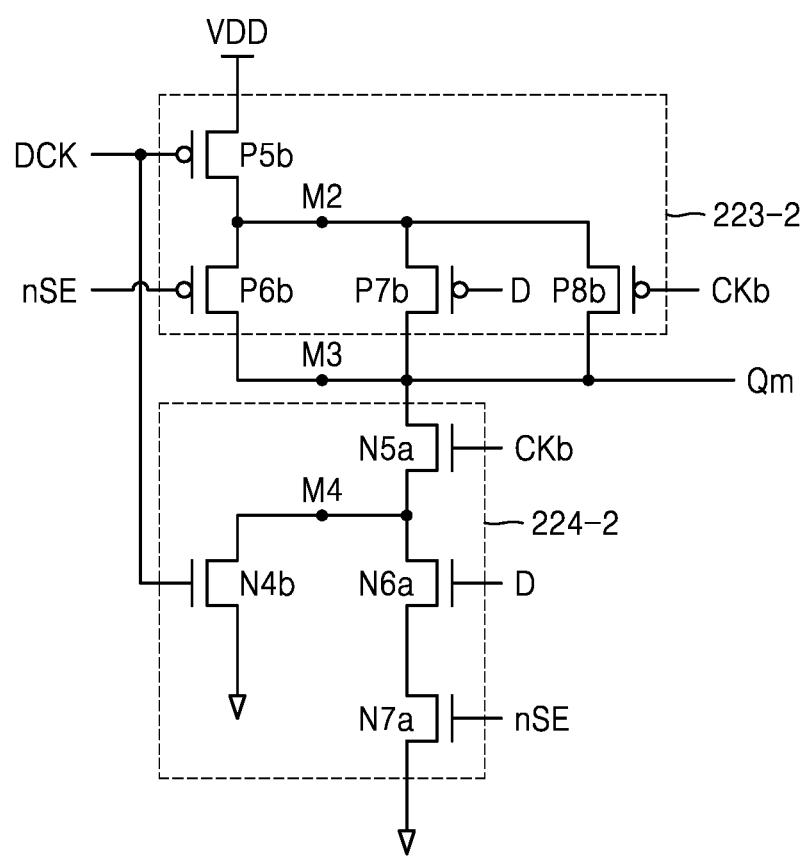
FIG. 7B is a circuit diagram of an AOI31 logic circuit according to an example embodiment of the inventive concept.

FIG. 7B is a circuit diagram of an AOI31 logic circuit 220a-2 according to an example embodiment of the inventive concept. Referring to FIG. 7B, the AOI31 logic circuit 220a-2 may include a pull-up circuit 223-2 and a pull-down circuit 224-2.

Unlike the AOI31 logic circuit 220a-1 of FIG. 7A, a source end of an eighth P-type transistor P8b in the AOI31 logic circuit 220a-2 may be commonly connected to the second node M2 to which source ends of sixth and seventh P-type transistors P6b and P7b are connected.

In addition, a drain end of a sixth N-type transistor N6b in the AOI31 logic circuit 220a-2 may be connected to the third node M3 at which the internal output signal Qm is output, and a source end of the sixth N-type transistor N6b may be connected to a fourth node M4. A drain end of a fourth N-type transistor N4b may be connected to the fourth node M4, and a source end of the fourth N-type transistor N4b may be connected to the ground node. A fifth N-type transistor N5b and a seventh N-type transistor N7b may be connected in series to form a series structure. One end of the series structure may be connected to the fourth node M4, and the other end of the series structure may be connected to the ground node.

As described below with reference to FIGS. 13B and 14B, in a flip flop according to example embodiments of the inventive concept, when the clock signal CK has the logic high level, the first internal signal DCK and the second internal signal CKb may have the same logic level as the data signal D. Otherwise, as described below with reference to FIGS. 13A and 14A, when the clock signal CK has the logic low level, the first internal signal DCK may have the logic low level and the second internal signal CKb may have the logic high level. That is, in the AOI31 logic circuit 220a-2, when the first internal signal DCK has the logic high level, the second internal signal CKb may also have the logic high level.

Accordingly, even when the drain end of the fourth N-type transistor N4b is not connected to the third node M3 but connected to the fourth node M4, the AOI31 logic circuit 220a-2 may normally operate. Therefore, the drain end of the fourth N-type transistor N4b may be selectively connected to the third node M3 or the fourth node M4, thereby increasing a degree of routing freedom of a flip flop.

Figure 8:
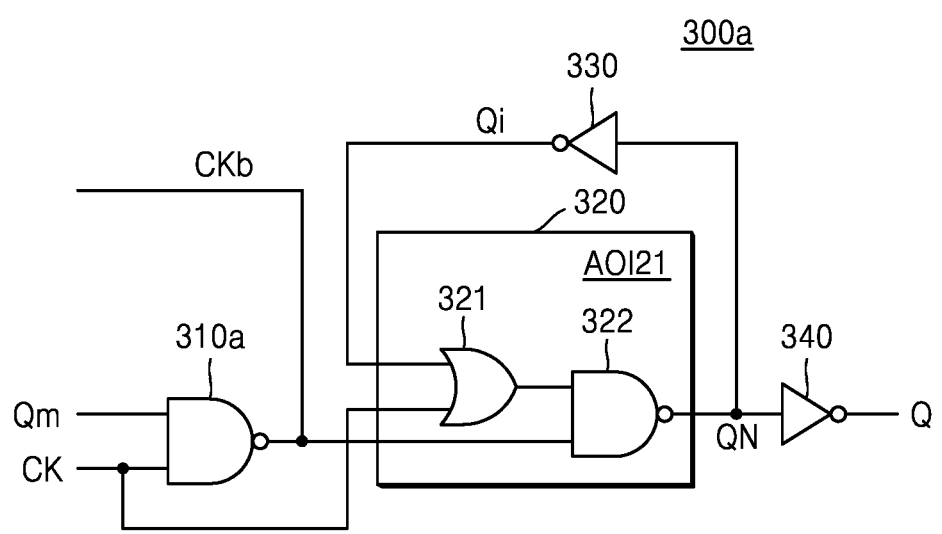
FIG. 8 is a circuit diagram of a slave latch according to an example embodiment of the inventive concept.

FIG. 8 is a circuit diagram of the slave latch 300a according to an example embodiment of the inventive concept. Referring to FIG. 8, the slave latch 300a may receive, as inputs, the internal output signal Qm and the clock signal CK and output the final signal Q.

The slave latch 300a may include the two-input NAND gate 310a. The NAND gate 310a may receive, as inputs, the internal output signal Qm and the clock signal CK and output the second internal signal CKb. When the clock signal CK has a particular logic level, the second internal signal CKb may have a logic level that is opposite to the logic level of the clock signal CK. For example, when the clock signal CK has the logic low level, the second internal signal CKb may have the logic high level regardless of the internal output signal Qm. Therefore, a flip flop according to an example embodiment of the inventive concept may generate the second internal signal CKb by inverting the clock signal CK when the clock signal CK has a particular level, even without including a clock inverter.

The slave latch 300a may include the OAI21 logic circuit 320. The OAI21 logic circuit 320 may include an OR gate 321 and a NAND gate 322. The OR gate 321 may receive, as inputs, the clock signal CK and the inverted signal Qi by inverting the output signal QN of the OAI21 logic circuit 320. The NAND gate 322 may receive, as inputs, an output signal of the OR gate 321 and the second internal signal CKb and output the output signal QN.

The slave latch 300a may include two inverters, e.g., the second and third inverters 330 and 340. The second inverter 330 may receive the output signal QN and provide, to the OAI21 logic circuit 320, the inverted signal Qi by inverting the output signal QN. The third inverter 340 may receive the output signal QN and output the final signal Q by inverting the output signal QN.

Figure 9A:
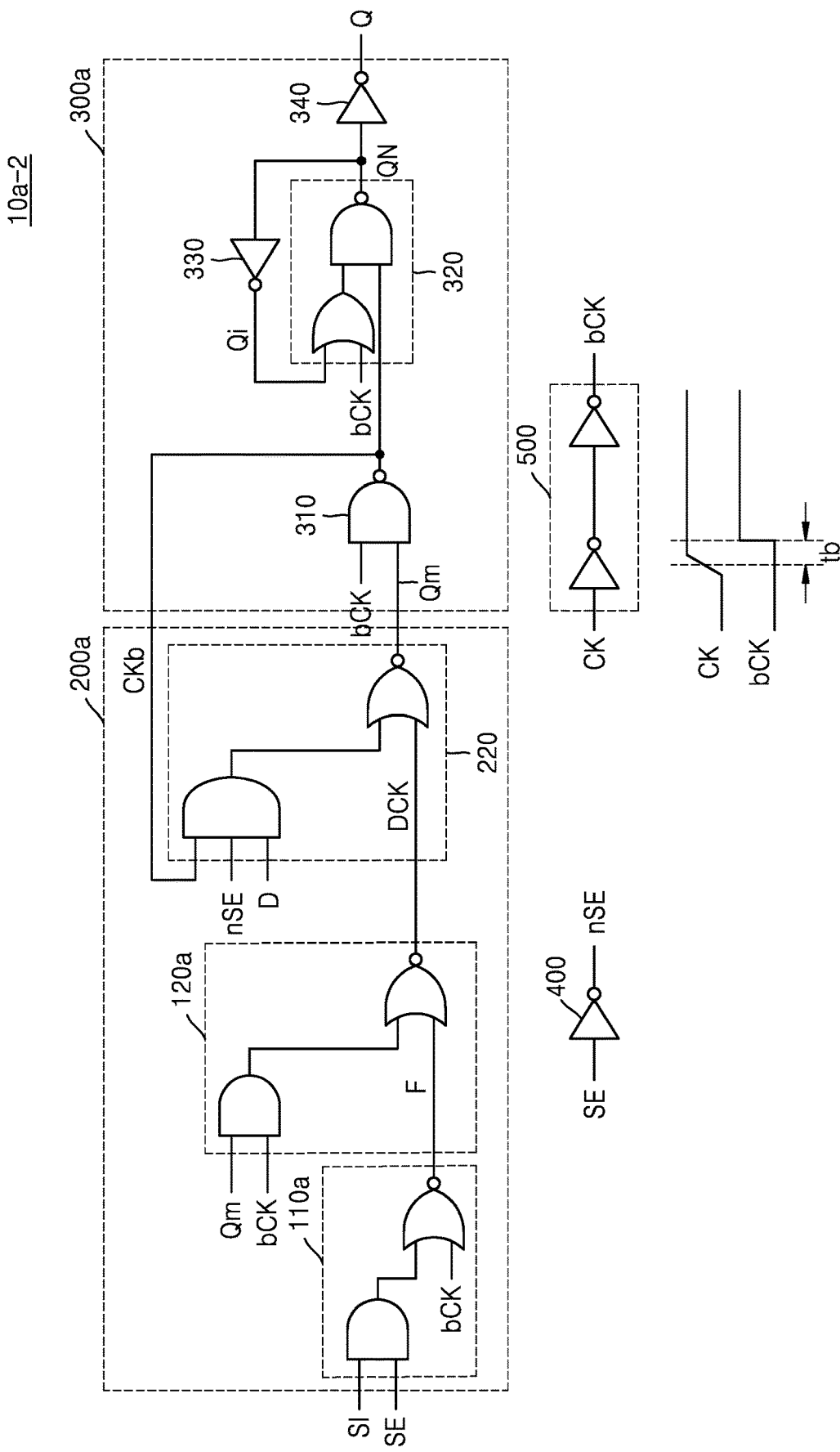
FIG. 9A is a circuit diagram of a flip flop according to an example embodiment of the inventive concept.

FIG. 9A is a circuit diagram of a flip flop 10a-2 according to an example embodiment of the inventive concept. Referring to FIG. 9A, the flip flop 10a-2 may further include a clock buffer 500. The clock buffer 500 may include two inverters. The clock buffer 500 may receive the clock signal CK and output a buffered clock signal bCK. Unlike the flip flop 10a shown in FIG. 3, the flip flop 10a-2 according to an example embodiment of the inventive concept may receive the buffered clock signal bCK instead of the clock signal CK.

Compared to the clock signal CK, the buffered clock signal bCK may have a certain buffer delay time tb. As shown in FIG. 2, a flip flop, which receives a relatively delayed data signal, among the scan flip flops 10-1, 10-2, and 10-3 included in the integrated circuit 100 may tune data latching timing with the other flip flops by receiving the buffered clock signal bCK.

A slew rate of the buffered clock signal bCK may be greater than a slew rate of the clock signal CK. Because a data signal is latched according to an active edge, the more a slew rate is, the more the reliability of a flip flop may be improved. According to an example embodiment of the inventive concept, the buffered clock signal bCK having a relatively high slew rate may be applied to a flip flop instead of the clock signal CK, thereby increasing the reliability of data latching.

Figure 9B:
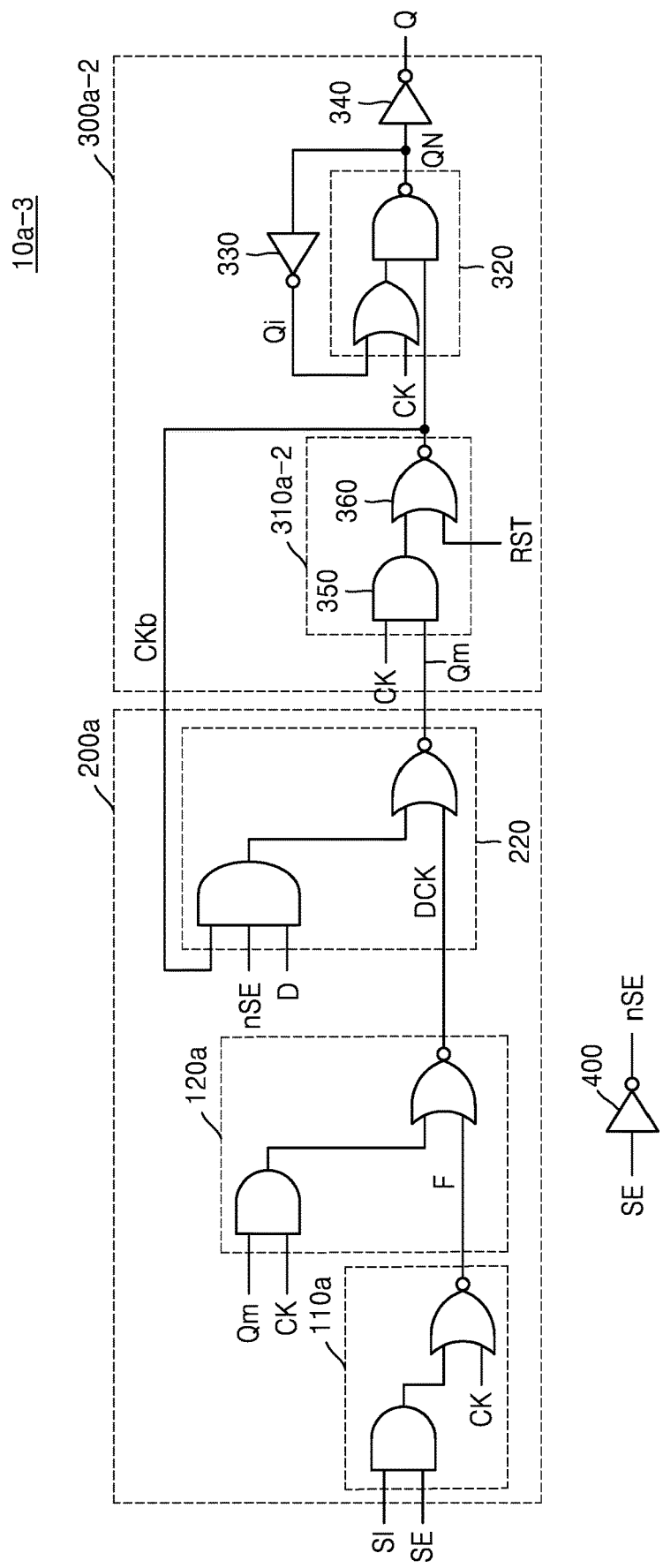
FIG. 9B is a circuit diagram of a flip flop according to an example embodiment of the inventive concept.

FIG. 9B is a circuit diagram of a flip flop 10a-3 according to an example embodiment of the inventive concept. Referring to FIG. 9B, the flip flop 10a-3 may include a slave latch 300a-2. Unlike the slave latch 300a of FIG. 3, the slave latch 300a-2 may include an AND gate 350 and a NOR gate 360.

Like the NAND gate 310a of FIG. 3, the AND gate 350 may receive the internal output signal Qm and the clock signal CK. The NOR gate 360 may receive an output signal of the AND gate 350 and a reset signal RST.

When the reset signal RST has the logic high level, an output signal of the NOR gate 360 may have the logic low level, and the final signal Q may be reset to the logic low level.

When the reset signal RST has the logic low level, the NOR gate 360 may operate as an inverter. Therefore, the AND gate 350 and the NOR gate 360 may be connected in series to operate as the NAND gate 310a of FIG. 3.

Figure 9C:
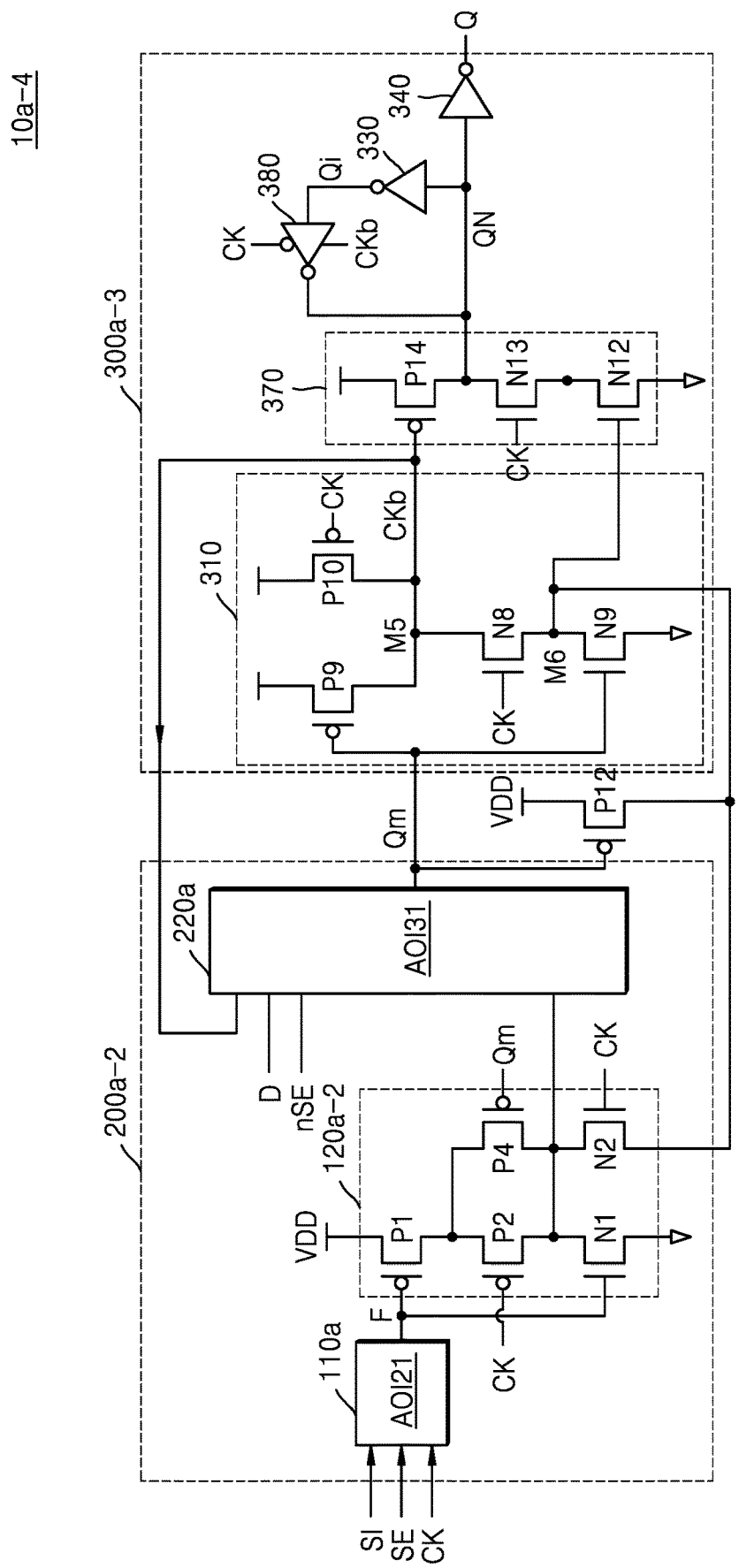
FIG. 9C is a circuit diagram of a flip flop according to an example embodiment of the inventive concept.

FIG. 9C is a circuit diagram of a flip flop 10a-4 according to an example embodiment of the inventive concept. Referring to FIG. 9C, the flip flop 10a-4 may include a twelfth P-type transistor P12. A slave latch 300a-3 may include a glitch protection circuit 370 and an inverter 380.

The internal output signal Qm may be input to a gate end of the twelfth P-type transistor P12, a source end of the twelfth P-type transistor P12 may be connected to the power supply node VDD, and a drain end of the twelfth P-type transistor P12 may be connected to a sixth node M6.

Figure 13A:
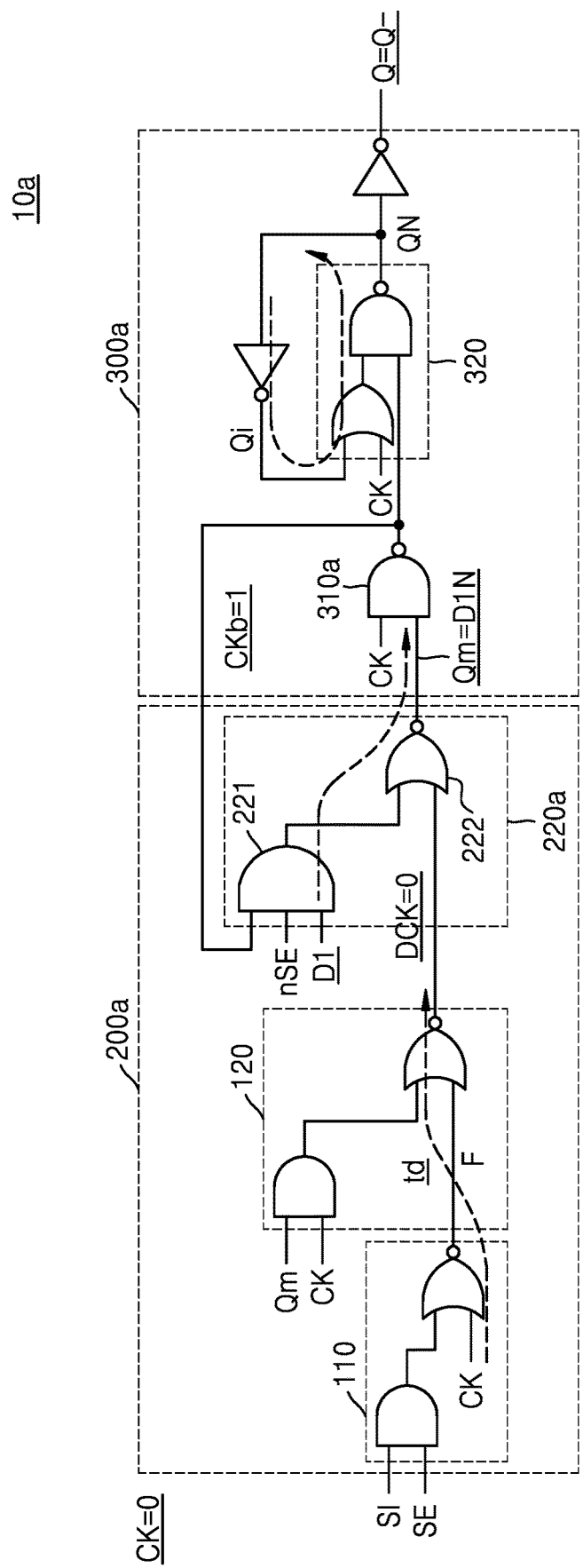
FIGS. 13A and 13B are circuit diagrams for describing the normal operation mode of a flip flop according to an example embodiment of the inventive concept.
Figure 13B:
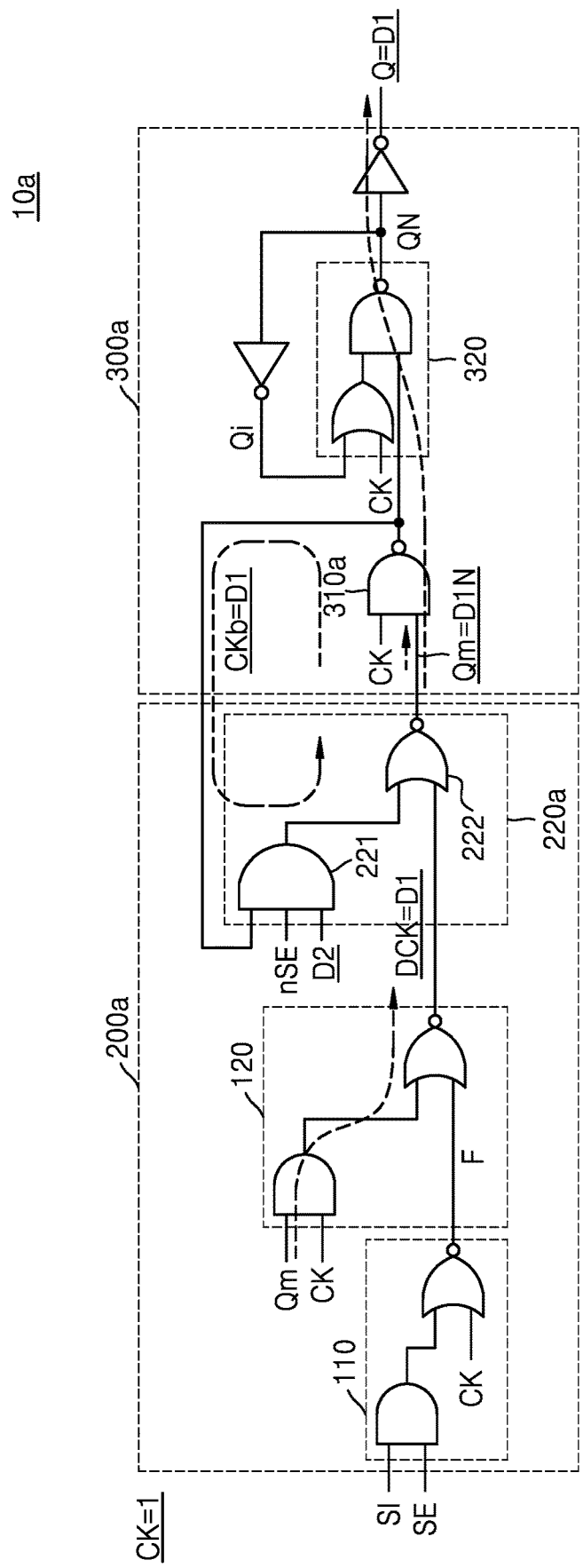
Figure 14A:
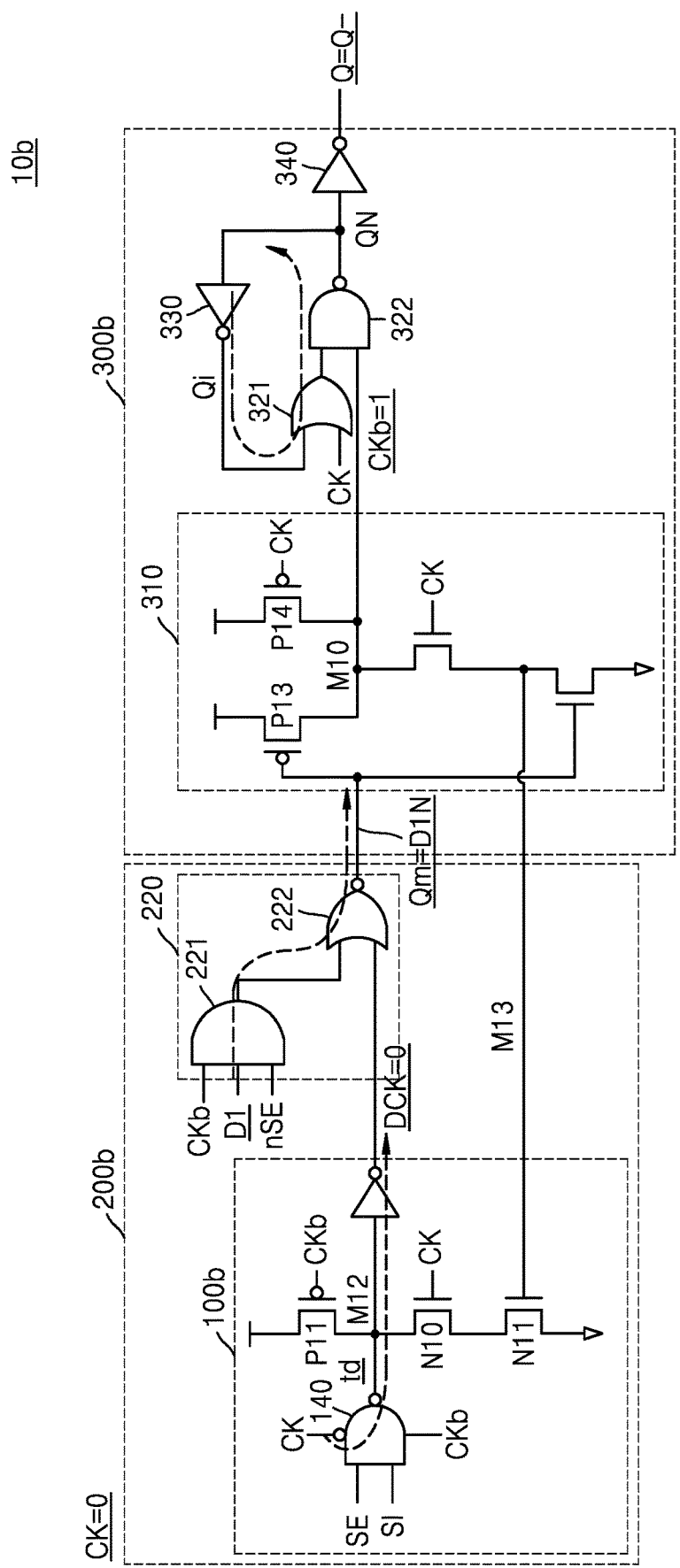
FIGS. 14A and 14B are circuit diagrams for describing the normal operation mode of a flip flop according to an example embodiment of the inventive concept.
Figure 14B:
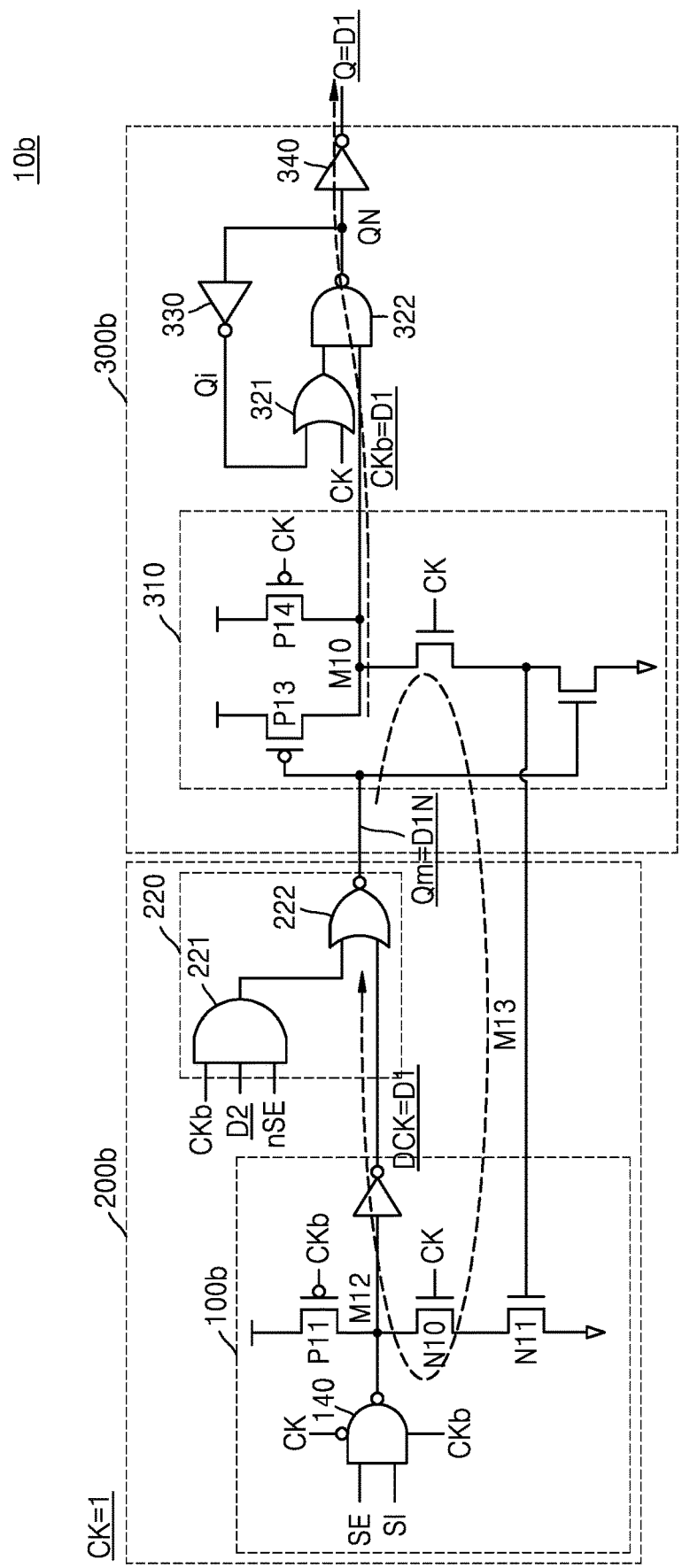

Referring to FIGS. 13B and 14B, when the clock signal CK has the logic high level, the internal output signal Qm may have a logic level inverted from the data signal D, and the second internal signal CKb may have the same logic level as the data signal D.

Referring to FIG. 9C, when the clock signal CK has the logic high level, an eighth N-type transistor N8 may be turned on, and the second internal signal CKb of a fifth node M5 may be input to the source end of the second N-type transistor N2 through the sixth node M6. Because the second N-type transistor N2 may be turned on by the clock signal CK, the second internal signal CKb transferred from the source end of the second N-type transistor N2 may be applied to the first node M1. When the clock signal CK has the logic high level, the second internal signal CKb may have the same logic level as the data signal D, and thus, the first internal signal DCK indicating a signal of the first node M1 may have the same logic level as the data signal D.

However, when the data signal D has the logic high level, a logic level of the sixth node M6 may be less than a logic level of the data signal D by a threshold voltage of the eighth N-type transistor N8. When the logic level of the sixth node M6 is low, a logic level of the first internal signal DCK may also be low, and thus, an error may occur in a general operation of the flip flop 10a-4. That is, a low voltage may be applied to the AOI31 logic circuit 220a by the threshold voltage of the eighth N-type transistor N8, and thus, the flip flop 10a-4 may perform a low-voltage operation.

When the data signal D has the logic high level, the twelfth P-type transistor P12 may be turned on, thereby increasing the logic level of the sixth node M6. Accordingly, the logic level of the first internal signal DCK may also be maintained as the logic high level, and thus, the low-voltage operation of the flip flop 10a-4 may be normalized.

The glitch protection circuit 370 may include a fourteenth P-type transistor P14, a twelfth N-type transistor N12, and a thirteenth N-type transistor N13.

As described below with reference to FIGS. 13B and 14B, when the clock signal CK has the logic high level, the second internal signal CKb may have the same logic level as the data signal D. For example, when the clock signal CK has the logic high level, the data signal D may be input to a gate end of the fourteenth P-type transistor P14. In addition, when the clock signal CK has the logic high level, the eighth N-type transistor N8 is turned on, and thus, the data signal D may be input to a gate end of the twelfth N-type transistor N12. When the clock signal CK has the logic high level, the thirteenth N-type transistor N13 is turned on, and thus, the glitch protection circuit 370 may operate as an inverter in which the data signal D is input to the twelfth N-type transistor N12 and the fourteenth P-type transistor P14.

However, when the data signal D has the logic high level, the logic level of the sixth node M6 may be less than the logic level of the data signal D by the threshold voltage of the eighth N-type transistor N8. When the logic level of the sixth node M6 is low, the twelfth N-type transistor N12 may not be turned on, and the glitch protection circuit 370 may not operate as an inverter. When the glitch protection circuit 370 does not operate as an inverter, the output signal QN may differ from an inverted value of the data signal D, and thus, a glitch may occur in the final signal Q.

As described above, because the twelfth P-type transistor P12 is turned on when the data signal D has the logic high level, the logic level of the sixth node M6 may increase. Accordingly, the twelfth N-type transistor N12 may be normally turned on, and the glitch protection circuit 370 may operate as an inverter. That is, the twelfth P-type transistor P12 may provide a stable logic high signal to the glitch protection circuit 370, thereby preventing the occurrence of a glitch in the final signal Q.

For example, when the clock signal CK has the logic low level, the second internal signal CKb has the logic high level, and thus, the thirteenth N-type transistor N13 and the fourteenth P-type transistor P14 may be turned off. In addition, because the inverter 380 is enabled when the clock signal CK has the logic low level, the final signal Q may maintain a constant value when the clock signal CK has the logic low level.

Figure 10A:
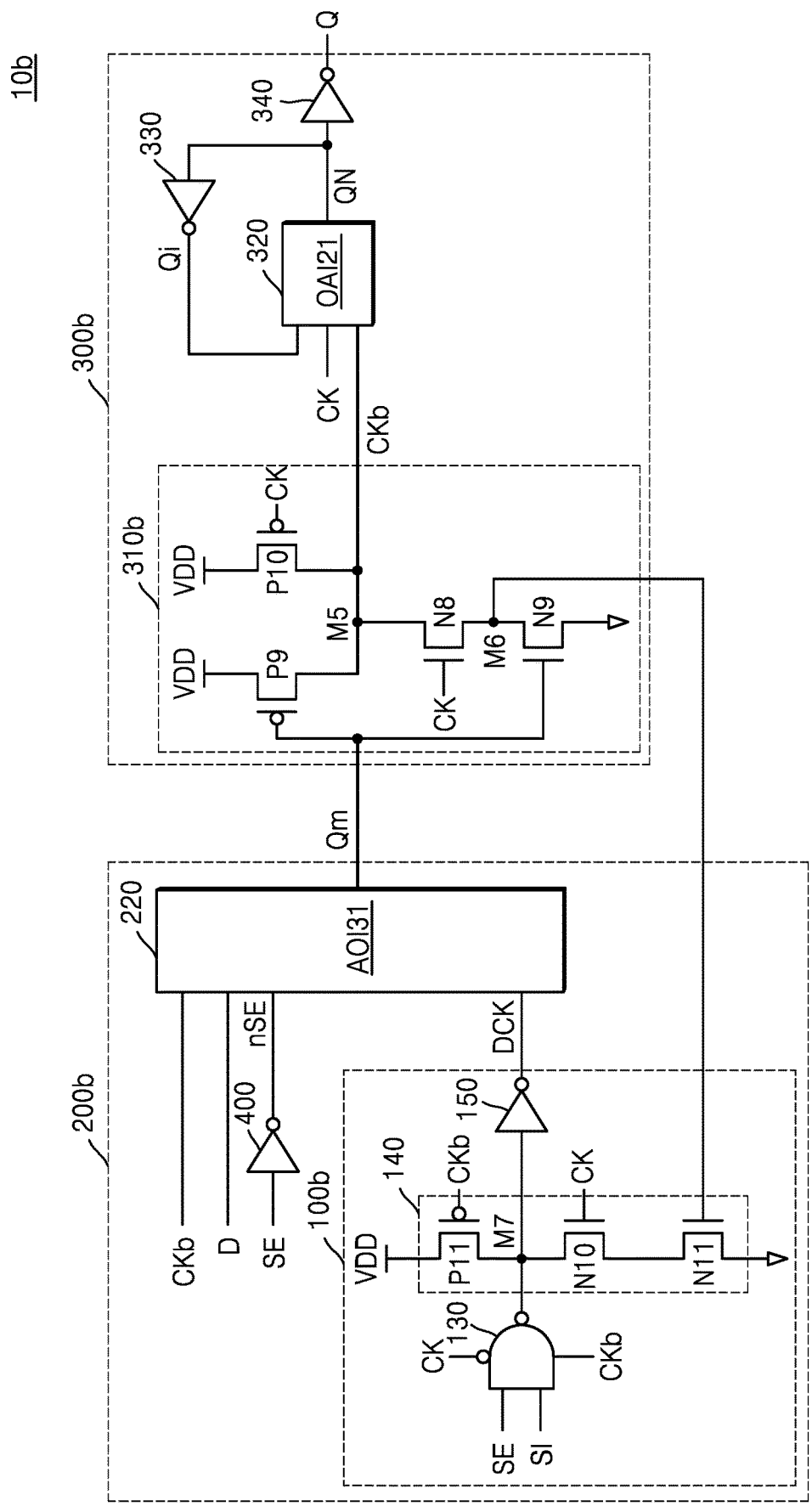
FIG. 10A is a circuit diagram of a flip flop according to an example embodiment of the inventive concept.

FIG. 10A is a circuit diagram of a flip flop 10b according to an example embodiment of the inventive concept. Referring to FIG. 10A, the flip flop 10b may include a master latch 200b and a slave latch 300b.

The slave latch 300b may include a NAND gate 310b. The NAND gate 310b may include ninth and tenth P-type transistors P9 and P10 and eighth and ninth N-type transistors N8 and N9.

The internal output signal Qm may be input to a gate end of the ninth P-type transistor P9, a source end of the ninth P-type transistor P9 may be connected to the power supply node VDD, and a drain end of the ninth P-type transistor P9 may be connected to a fifth node M5. The clock signal CK may be input to a gate end of the tenth P-type transistor P10, a source end of the tenth P-type transistor P10 may be connected to the power supply node VDD, and a drain end of the tenth P-type transistor P10 may be connected to the fifth node M5.

The clock signal CK may be input to a gate end of the eighth N-type transistor N8, a source end of the eighth N-type transistor N8 may be connected to a sixth node M6, and a drain end of the eighth N-type transistor N8 may be connected to the fifth node M5. The internal output signal Qm may be input to a gate end of the ninth N-type transistor N9, a source end of the ninth N-type transistor N9 may be connected to the ground node, and a drain end of the ninth N-type transistor N9 may be connected to the sixth node M6.

Unlike the NAND gate 310a of FIG. 3, the logic level of the sixth node M6 that is an internal node of the NAND gate 310b may be fed back to the master latch 200b.

The master latch 200b may include a delay circuit 100b. Unlike the delay circuit 100a of FIG. 3, the delay circuit 100b may include a NAND gate 130, a circuit part 140, and an inverter 150. The NAND gate 130 may receive the scan enable signal SE and the scan input signal SI and may be enabled in response to the clock signal CK. An output signal of the NAND gate 130 may be output to a seventh node M7. The circuit part 140 may include a plurality of transistors, e.g., an eleventh P-type transistor P11 and tenth and eleventh N-type transistors N10 and N11. The second internal signal CKb may be input to a gate end of the eleventh P-type transistor P11, a source end of the eleventh P-type transistor P11 may be connected to the power supply node VDD, and a drain end of the eleventh P-type transistor P11 may be connected to the seventh node M7. The clock signal CK may be input to a gate end of the tenth N-type transistor N10. A gate end of the eleventh N-type transistor N11 may be connected to the sixth node M6 that is an internal node of the slave latch 300b. Referring to FIGS. 13B and 14B, when the clock signal CK has the logic high level, the sixth node M6 may have the same logic level as the data signal D. In addition, when the clock signal CK has the logic high level, the second internal signal CKb may also have the same logic level as the data signal D, and thus, the circuit part 140 may operate as an inverter. Therefore, the circuit part 140 may output an inverted value of the data signal D. As a result, the first internal signal DCK may have the same logic level as the data signal D through the inverter 150.

Figure 10B:
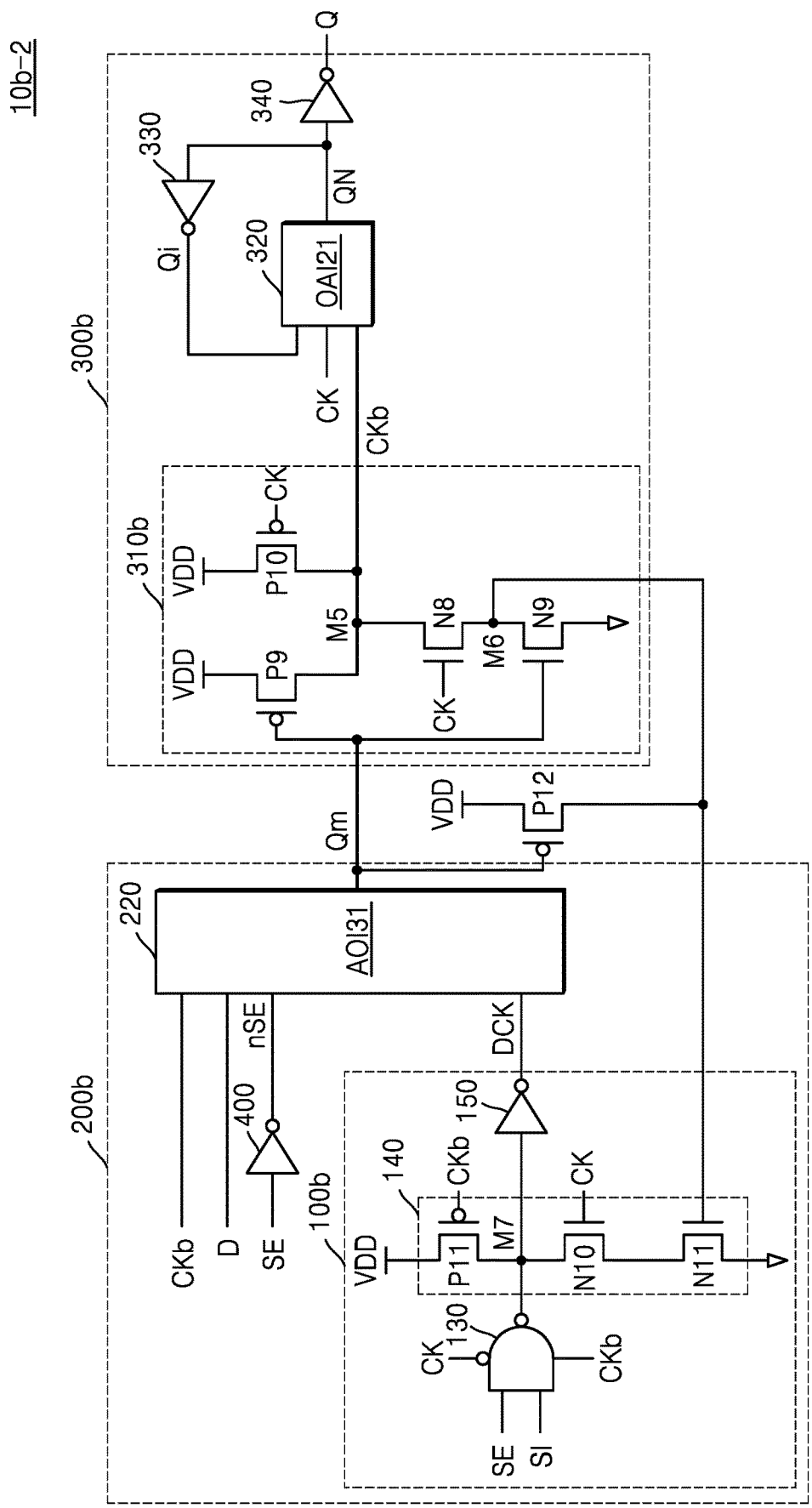
FIG. 10B is a circuit diagram of a flip flop according to an example embodiment of the inventive concept.

FIG. 10B is a circuit diagram of a flip flop 10b-2 according to an example embodiment of the inventive concept. Referring to FIG. 10B, unlike the flip flop 10b of FIG. 10A, the flip flop 10b-2 may further include the twelfth P-type transistor P12. The internal output signal Qm may be input to the gate end of the twelfth P-type transistor P12, the source end of the twelfth P-type transistor P12 may be connected to the power supply node VDD, and the drain end of the twelfth P-type transistor P12 may be connected to the sixth node M6.

Referring to FIGS. 13B and 14B, when the clock signal CK has the logic high level, the internal output signal Qm may have a logic level inverted from the data signal D, and the second internal signal CKb may have the same logic level as the data signal D.

Referring to FIG. 10B, when the clock signal CK has the logic high level, the eighth N-type transistor N8 may be turned on, and the second internal signal CKb of the fifth node M5 may be input to the gate end of the eleventh N-type transistor N11 through the sixth node M6. However, when the data signal D has the logic high level, the logic level of the sixth node M6 may be less than the logic level of the data signal D by the threshold voltage of the eighth N-type transistor N8. When the logic level of the sixth node M6 is low, the eleventh N-type transistor N11 may not be turned on, and the circuit part 140 may not operate as an inverter.

When the data signal D has the logic high level, the twelfth P-type transistor P12 may be turned on, thereby increasing the logic level of the sixth node M6. Accordingly, the eleventh N-type transistor N11 may be normally turned on, and the circuit part 140 may operate as an inverter. That is, the twelfth P-type transistor P12 may provide a stable logic high signal to the circuit part 140 so that the circuit part 140 operates as a normal inverter.

Figure 10C:
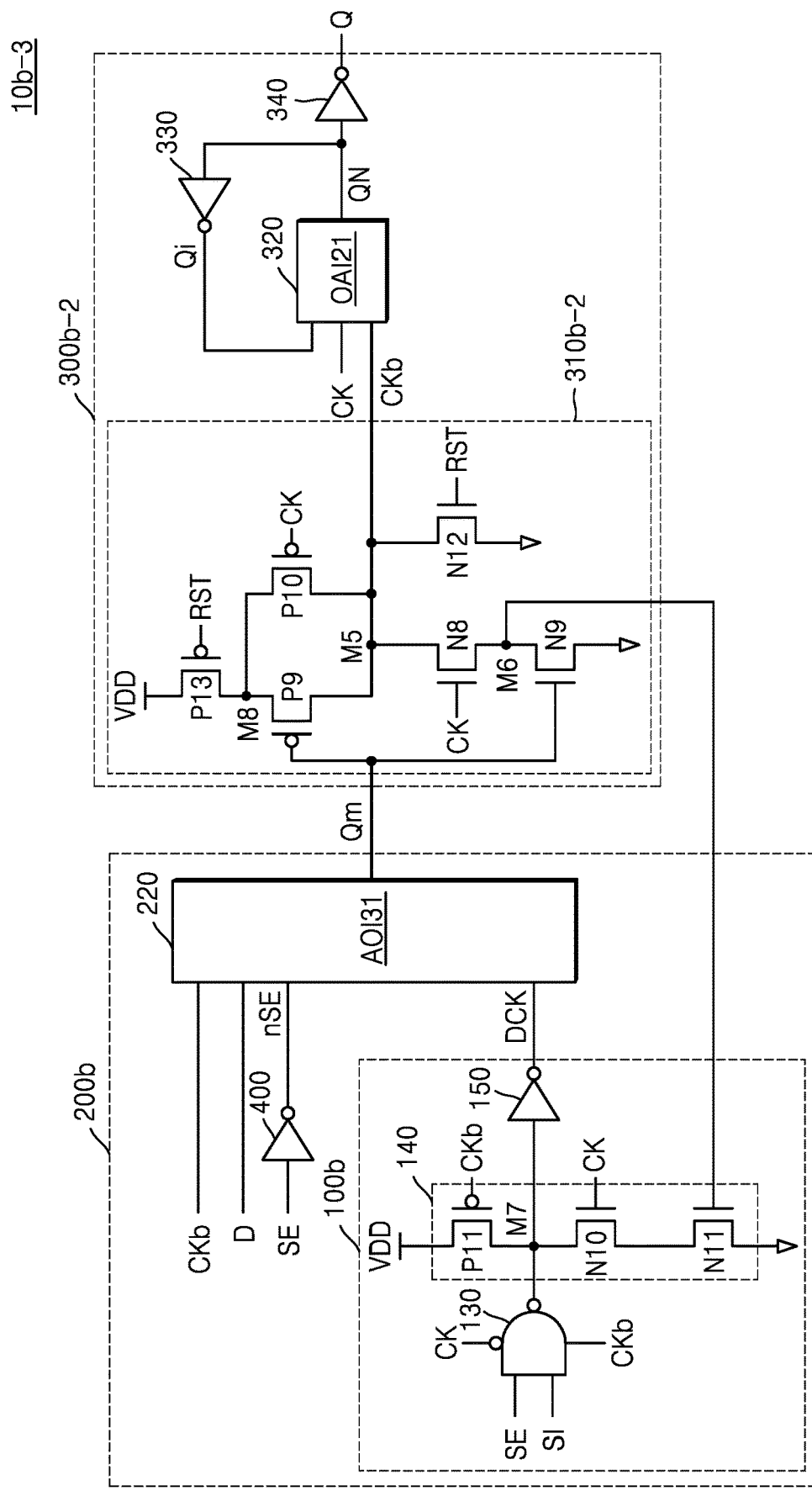
FIG. 10C is a circuit diagram of a flip flop according to an example embodiment of the inventive concept.

FIG. 10C is a circuit diagram of a flip flop 10b-3 according to an example embodiment of the inventive concept. Referring to FIG. 10C, the flip flop 10b-3 may include a slave latch 300b-2, and the slave latch 300b-2 may include a NAND gate 310b-2, which is reset by the reset signal RST. The NAND gate 310b-2 may further include reset transistors, e.g., a thirteenth P-type transistor P13 and the twelfth N-type transistor N12.

The reset signal RST may be input to a gate end of the thirteenth P-type transistor P13, a source end of the thirteenth P-type transistor P13 may be connected to the power supply node VDD, and a drain end of the thirteenth P-type transistor P13 may be connected to an eighth node M8. The source end of the ninth P-type transistor P9 may be connected to the eighth node M8, and the drain end of the ninth P-type transistor P9 may be connected to a fifth node M5. The source end of the tenth P-type transistor P10 may be connected to the eighth node M8, and the drain end of the tenth P-type transistor P10 may be connected to the fifth node M5. When the reset signal RST has the logic high level, the thirteenth P-type transistor P13 is turned off, and thus, the fifth node M5 may not be pulled-up regardless of signals respectively applied to gate ends of the ninth and tenth P-type transistors P9 and P10. When the reset signal RST has the logic low level, a pull-up circuit of the NAND gate 310b-2 may operate substantially the same as a pull-up circuit of the NAND gate 310b of FIGS. 10A and 10B.

The reset signal RST may be input to a gate end of the twelfth N-type transistor N12. When the reset signal RST has the logic high level, the fifth node M5 is discharged by the twelfth N-type transistor N12 turned on, and thus, the second internal signal CKb may have the logic low level. When the second internal signal CKb has the logic low level, the final signal Q has the logic low level by the OAI21 logic circuit 320, and thus, the flip flop 10b-3 may be reset. When the reset signal RST has the logic low level, a pull-down circuit of the NAND gate 310b-2 may operate the same as a pull-down circuit of the NAND gate 310b of FIGS. 10A and 10B.

Figure 10D:
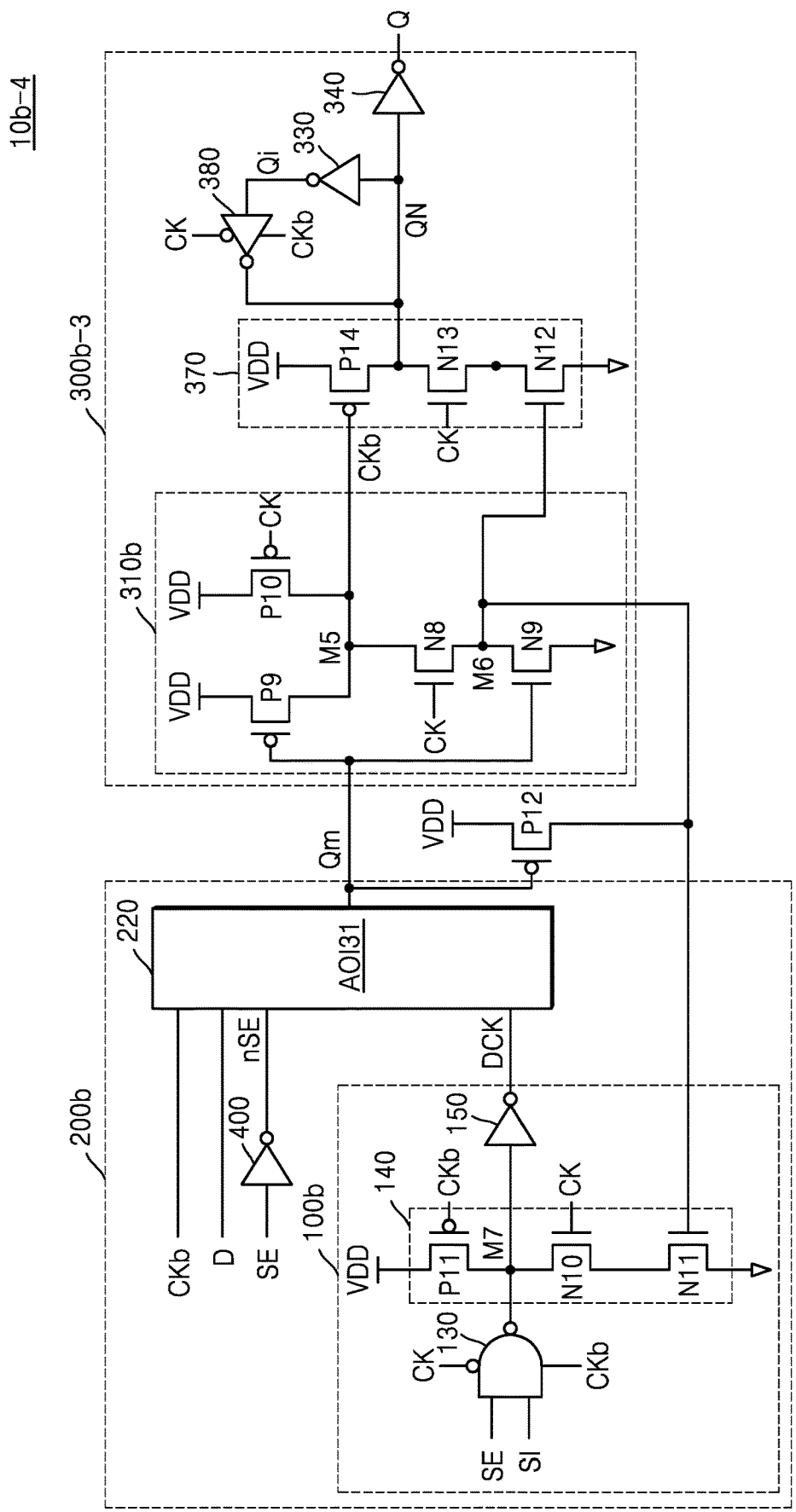
FIG. 10D is a circuit diagram of a flip flop according to an example embodiment of the inventive concept.

FIG. 10D is a circuit diagram of a flip flop 10b-4 according to an example embodiment of the inventive concept. Referring to FIG. 10D, the flip flop 10b-4 may include a slave latch 300b-3, and the slave latch 300b-3 may include the glitch protection circuit 370 and the inverter 380.

The glitch protection circuit 370 may include the fourteenth P-type transistor P14, the twelfth N-type transistor N12, and the thirteenth N-type transistor N13.

As described below with reference to FIGS. 13B and 14B, when the clock signal CK has the logic high level, the second internal signal CKb may have the same logic level as the data signal D. For example, when the clock signal CK has the logic high level, the data signal D may be input to the gate end of the fourteenth P-type transistor P14. In addition, when the clock signal CK has the logic high level, the eighth N-type transistor N8 is turned on, and thus, the data signal D may be input to the gate end of the twelfth N-type transistor N12. When the clock signal CK has the logic high level, the thirteenth N-type transistor N13 is turned on, and thus, the glitch protection circuit 370 may operate as an inverter in which the data signal D is input to the twelfth N-type transistor N12 and the fourteenth P-type transistor P14.

However, when the data signal D has the logic high level, the logic level of the sixth node M6 may be less than the logic level of the data signal D by the threshold voltage of the eighth N-type transistor N8. When the logic level of the sixth node M6 is low, the twelfth N-type transistor N12 may not be turned on, and the glitch protection circuit 370 may not operate as an inverter. When the glitch protection circuit 370 does not operate as an inverter, the output signal QN may differ from an inverted value of the data signal D, and thus, a glitch may occur in the final signal Q.

As described above with reference to FIG. 10B, the twelfth P-type transistor P12 may be turned on when the data signal D has the logic high level, thereby increasing the logic level of the sixth node M6. Accordingly, the twelfth N-type transistor N12 may be normally turned on, and the glitch protection circuit 370 may operate as an inverter. That is, the twelfth P-type transistor P12 may provide a stable logic high signal to the glitch protection circuit 370, thereby preventing the occurrence of a glitch in the final signal Q.

For example, when the clock signal CK has the logic low level, the second internal signal CKb has the logic high level, and thus, the thirteenth N-type transistor N13 and the fourteenth P-type transistor P14 may be turned off. In addition, because the inverter 380 is enabled when the clock signal CK has the logic low level, the final signal Q may maintain a constant value when the clock signal CK has the logic low level.

Figure 10E:
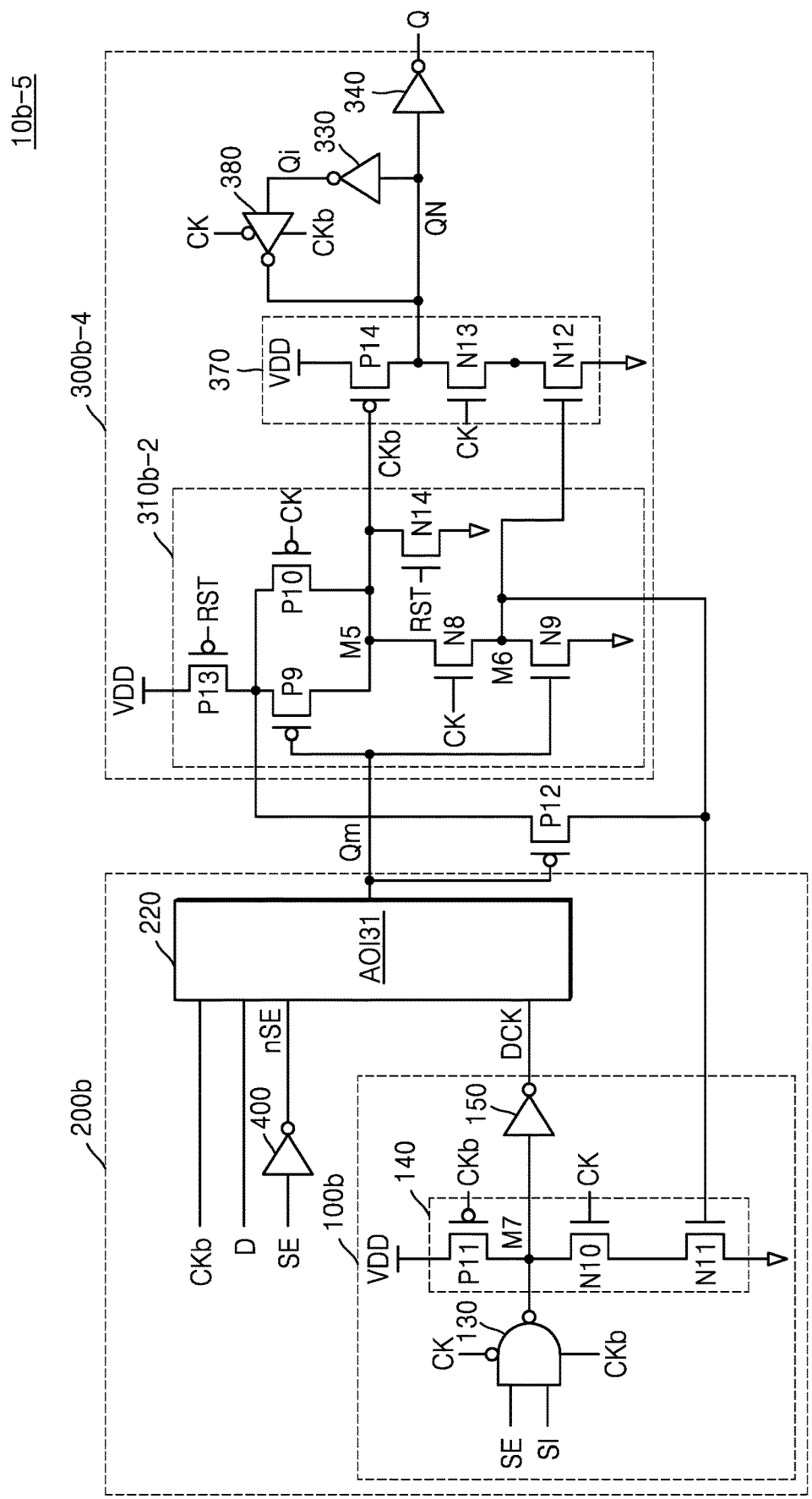
FIG. 10E is a circuit diagram of a flip flop according to an example embodiment of the inventive concept.

FIG. 10E is a circuit diagram of a flip flop 10b-5 according to an example embodiment of the inventive concept. Referring to FIG. 10E, the flip flop 10b-5 may include a slave latch 300b-4, and the slave latch 300b-4 may include the NAND gate 310b-2, which is reset by the reset signal RST, the NAND gate 310b-2 being described above with reference to FIG. 10C. The NAND gate 310b-2 may further include reset transistors, e.g., the thirteenth P-type transistor P13 and the fourteenth N-type transistor N14.

FIG. 10E includes the glitch protection circuit 370 and the twelfth P-type transistor P12 described above with reference to FIG. 10D, and thus, the occurrence of a glitch in the final signal Q may be prevented. In addition, FIG. 10E includes the NAND gate 310b-2 described above with reference to FIG. 10C, and thus, the final signal Q may be reset in response to the reset signal RST.

Figure 11:
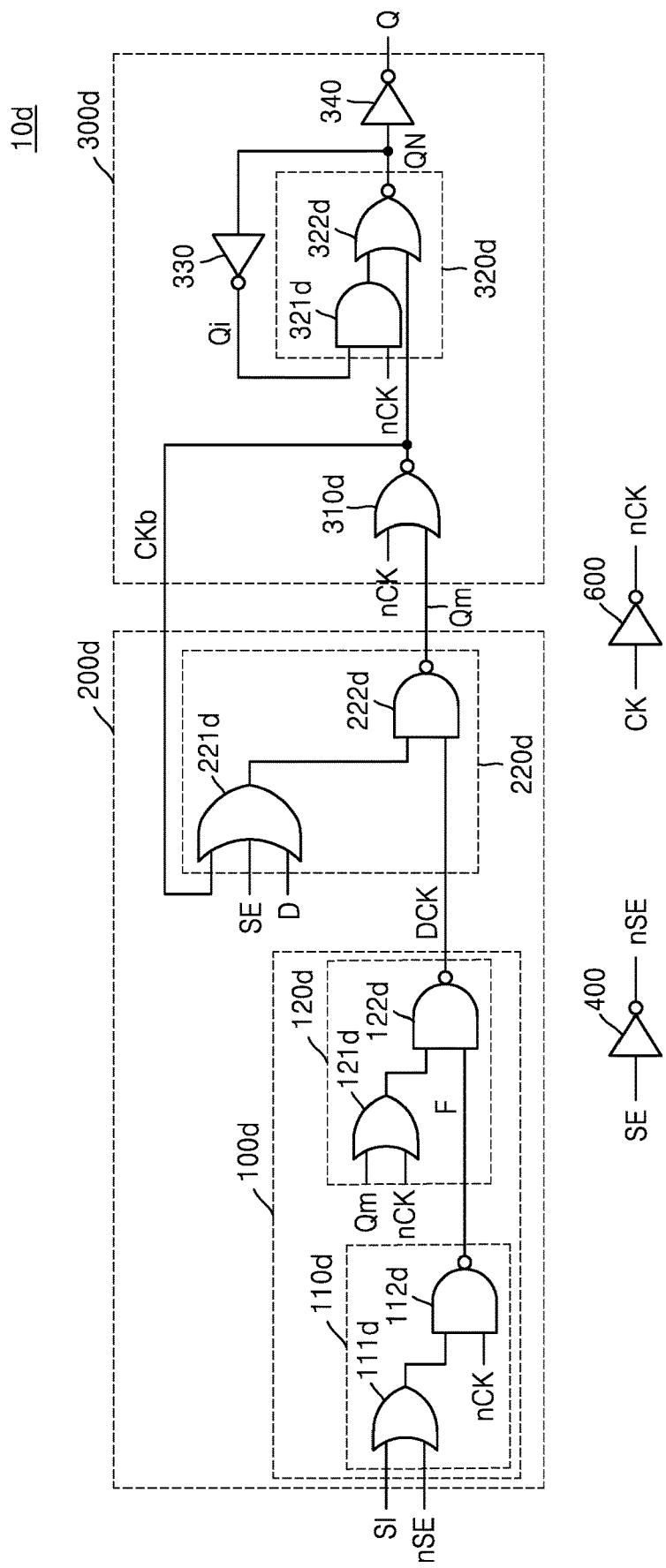
FIG. 11 is a circuit diagram of a flip flop according to an example embodiment of the inventive concept.

FIG. 11 is a circuit diagram of a flip flop 10d according to an example embodiment of the inventive concept. Referring to FIG. 11, the flip flop 10d may include a clock inverter 600. The clock inverter 600 may receive the clock signal CK and output an inverted clock signal nCK. The flip flop 10d may include a master latch 200d and a slave latch 300d, and the master latch 200d may include a delay circuit 100d.

Unlike the delay circuit 100a of FIG. 3, the delay circuit 100d may include a first OAI21 logic circuit 110d and a second OAI21 logic circuit 120d. The first OAI21 logic circuit 110d may include an OR gate 111d and a NAND gate 112d. The OR gate 111d may receive the scan input signal SI and the inverted scan enable signal nSE. The NAND gate 112d may receive an output signal of the OR gate 111d and the inverted clock signal nCK and output the intermediate signal F. The second OAI21 logic circuit 120d may include an OR gate 121d and a NAND gate 122d. The OR gate 121d may receive the internal output signal Qm and the inverted clock signal nCK. The NAND gate 122d may receive an output signal of the OR gate 121d and the intermediate signal F and output the first internal signal DCK.

Unlike the master latch 200a of FIG. 3, the master latch 200d may include an OAI31 logic circuit 220d. The OAI31 logic circuit 220d may include an OR gate 221d and a NAND gate 222d. The OR gate 221d may receive the second internal signal CKb, the scan enable signal SE, and the data signal D. The NAND gate 222d may receive an output signal of the OR gate 221d and the first internal signal DCK and output the internal output signal Qm.

Unlike the slave latch 300a of FIG. 3, the slave latch 300d may include a NOR gate 310d, which outputs the second internal signal CKb. The NOR gate 310d may receive the inverted clock signal nCK and the internal output signal Qm and output the second internal signal CKb. Unlike the slave latch 300a of FIG. 3, the slave latch 300d may include an AOI21 logic circuit 320d. The AOI21 logic circuit 320d may include an AND gate 321d and a NOR gate 322d. The AND gate 321d may receive the inverted clock signal nCK and the inverted signal Qi. The NOR gate 322d may receive an output signal of the AND gate 321d and the second internal signal CKb and output the output signal QN. The third inverter 340 may receive the output signal QN and output the final signal Q by inverting the output signal QN.

Figure 12A:
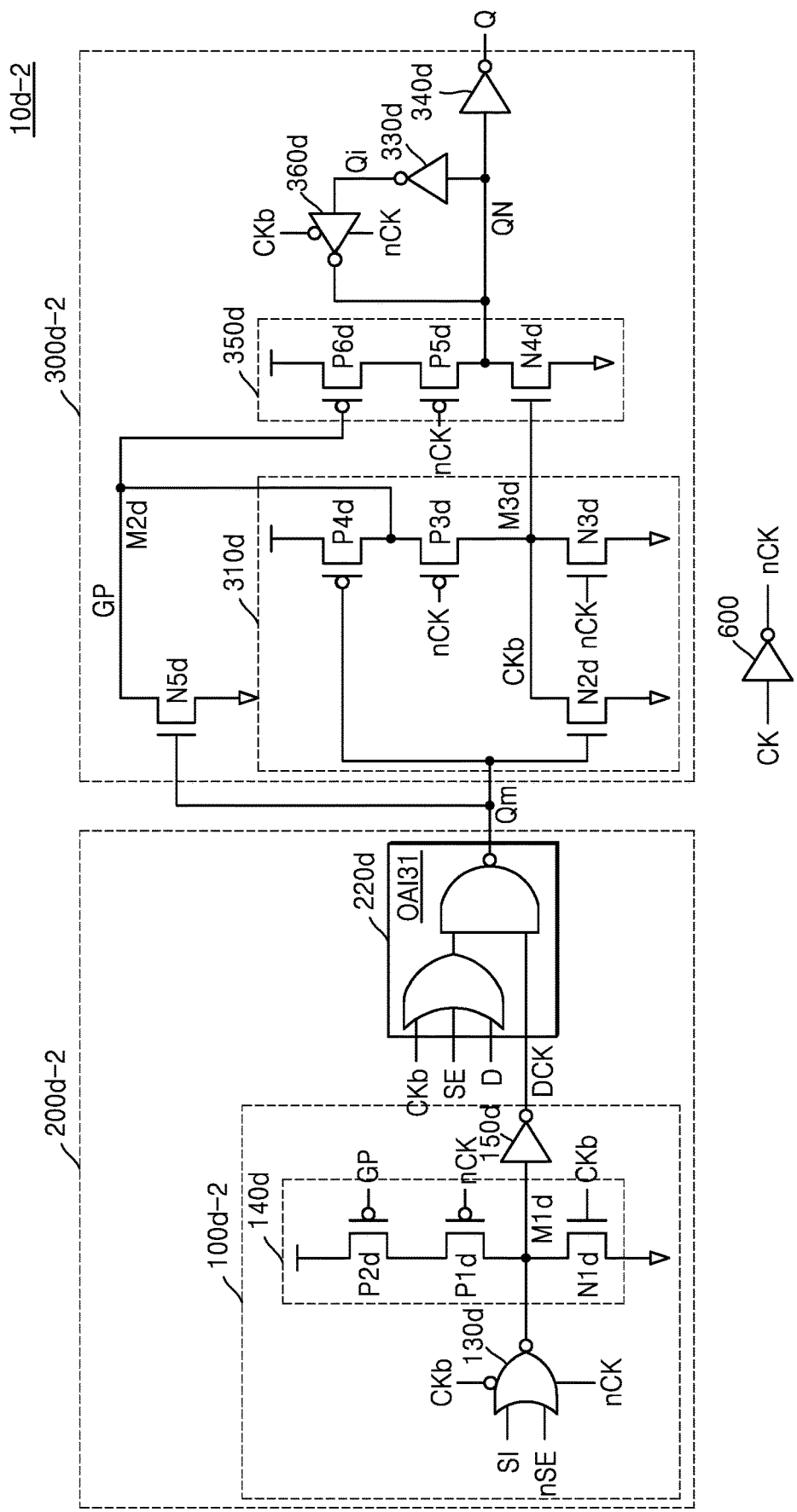
FIG. 12A is a circuit diagram of a flip flop according to an example embodiment of the inventive concept.

FIG. 12A is a circuit diagram of a flip flop 10d-2 according to an example embodiment of the inventive concept. For example, FIG. 12A shows that the flip flop 10d-2 uses the inverted clock signal nCK. The description made above with reference to FIGS. 1 to 6, 7A, 7B, 8, 9A to 9C, 10A to 10E, and 11 may be omitted in a description to be made with reference to FIG. 12A. Referring to FIG. 12A, the flip flop 10d-2 may include a master latch 200d-2 and a slave latch 300d-2.

The master latch 200d-2 may include a delay circuit 100d-2. Unlike the delay circuit 100d of FIG. 11, the delay circuit 100d-2 may include a NOR gate 130d, a circuit part 140d, and an inverter 150d. The NOR gate 130d may receive the inverted scan enable signal nSE and the scan input signal SI and may be enabled in response to the inverted clock signal nCK and the second internal signal CKb. An output signal of the NOR gate 130d may be output to a first node M1d. The circuit part 140d may include a plurality of transistors, e.g., first and second P-type transistors P1d and P2d and a first N-type transistor N1d. The second internal signal CKb may be input to a gate end of the first N-type transistor N1d, a source end of the first N-type transistor N1d may be connected to the ground node, and a drain end of the first N-type transistor N1d may be connected to the first node M1d. The inverted clock signal nCK may be input to a gate end of the first P-type transistor P1d. A gate end of the second P-type transistor P2d may be connected to a second node M2d that is an internal node of the slave latch 300d-2, so that a glitch protection signal GP of the second node M2d is applied to the gate end of the second P-type transistor P2d. When the inverted clock signal nCK has the logic high level, the second internal signal CKb may have logic low level by the third N-type transistor N3d. On the normal operation mode, inverted scan enable signal nSE has the logic high level and scan input signal has the logic low level. Thus, the first node M1d has the logic low level and the first internal signal DCK has logic high level. The internal output signal Qm has the same logic level as an inverted data signal /D by OAI31 logic circuit 220d. The glitch protection signal GP of the second node M2d has the same logic level as an inverted logic level of the internal output signal Qm. For example, a logic level of the glitch protection signal GP may be the same as a logic level of the data signal D. In addition, when the inverted clock signal nCK has the logic low level, the second internal signal CKb may have the same logic level as the data signal D as a third P-type transistor P3d turned on. Therefore, the circuit part 140d may operate as an inverter. For example, the circuit part 140d may output an inverted value of the data signal D. As a result, the first internal signal DCK may have the same logic level as the data signal D by the delay circuit 100d-2.

The slave latch 300d-2 may include the NOR gate 310d, a glitch protection circuit 350d, and a fifth N-type transistor N5d. The internal output signal Qm may be input to a gate end of the fifth N-type transistor N5d, a source end of the fifth N-type transistor N5d may be connected to the ground node, and a drain end of the fifth N-type transistor N5d may be connected to the second node M2d.

When the inverted clock signal nCK has the logic high level, the second internal signal CKb may have the logic low level by a third N-type transistor N3d. When the second internal signal CKb has the logic low level, in the normal operation mode (e.g., SE=0), the internal output signal Qm may have an inverted logic level of the data signal D by the OAI31 logic circuit 220d. For example, when the inverted clock signal nCK has the logic high level, the inverted logic level of the data signal D may be latched to the internal output signal Qm.

When the inverted clock signal nCK transitions to the logic low level, the NOR gate 310d may operate as an inverter, which receives the internal output signal Qm as an input. Therefore, the second internal signal CKb may have the same logic level as the data signal D. For example, when the inverted clock signal nCK has the logic low level, the second node M2d may have the same logic level as a third node M3d by the third P-type transistor P3d turned on. For example, when the inverted clock signal nCK has the logic low level, the second node M2d may have the same logic level as the data signal D.

When the data signal D has the logic low level, the logic level of the second node M2d may be greater than the logic level of the data signal D by a threshold voltage of a third P-type transistor P3d. When the logic level of the second node M2d is high, the second P-type transistor P2d may not be turned on, and the circuit part 140d may not operate as an inverter.

The fifth N-type transistor N5d according to an example embodiment of the inventive concept is turned on when the inverted clock signal nCK has the logic low level and the data signal D has the logic low level (for example, the internal output signal Qm has the logic high level), and thus, the logic level of the second node M2d may decrease. Accordingly, the second P-type transistor P2d may be normally turned on, and the circuit part 140d may operate as an inverter. For example, the fifth N-type transistor N5d may provide a stable logic low signal to the circuit part 140d so that the circuit part 140d operates as a normal inverter.

The glitch protection circuit 350d may include a fourth N-type transistor N4d, a fifth P-type transistor P5d, and a sixth P-type transistor P6d.

When the clock signal CK has the logic high level, the second internal signal CKb may have the same logic level as the data signal D, and thus, the glitch protection circuit 350d may operate as an inverter, which receives the data signal D.

However, when the data signal D has the logic low level, the logic level of the second node M2d may be greater than the logic level of the data signal D by a threshold voltage of the third P-type transistor P3d. When the logic level of the second node M2d is high, the sixth P-type transistor P6d may not be turned on, and the glitch protection circuit 350d may not operate as an inverter. When the glitch protection circuit 350d does not operate as an inverter, the output signal QN may differ from an inverted value of the data signal D, and thus a glitch may occur in the final signal Q.

As described above, the fifth N-type transistor N5d is turned on when the data signal D has the logic low level, and thus, the logic level of the second node M2d may decrease. Accordingly, the sixth P-type transistor P6d may be normally turned on, and the glitch protection circuit 350d may operate as an inverter. For example, the fifth N-type transistor N5d may provide a stable logic low signal to the glitch protection circuit 350d so that the occurrence of a glitch in the final signal Q is prevented.

Figure 12B:
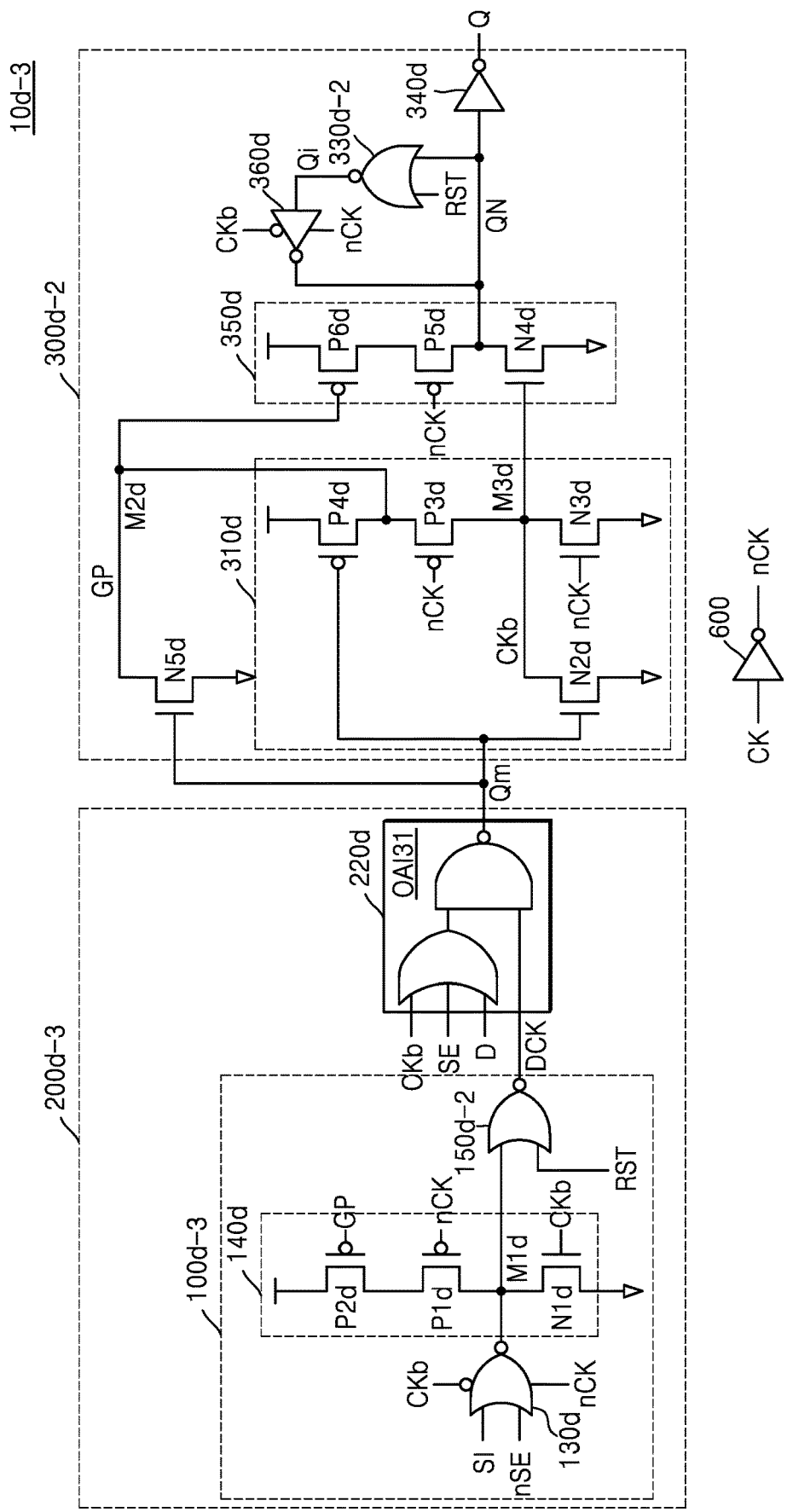
FIG. 12B is a circuit diagram of a flip flop according to an example embodiment of the inventive concept.

FIG. 12B is a circuit diagram of a flip flop 10d-3 according to an example embodiment of the inventive concept. Referring to FIG. 12B, the flip flop 10d-3 may include a first NOR gate 150d-2 and a second NOR gate 330d-2.

The first NOR gate 150d-2 may receive an output signal of the circuit part 140d and the reset signal RST and output the first internal signal DCK. When the reset signal RST has the logic high level, the internal output signal Qm may be reset to the logic high level.

The second NOR gate 330d-2 may receive the output signal QN and the reset signal RST and output an inverted output signal Qi. When the reset signal RST has the logic high level, the final signal Q may be reset to the logic low level.

FIGS. 13A and 13B are circuit diagrams for describing the normal operation mode of the flip flop 10a according to an example embodiment of the inventive concept. For example, FIG. 13A shows the normal operation mode of the flip flop 10a when the clock signal CK has the logic low level. More specifically, FIG. 13A illustrates a case that a first data signal D1 is applied to the AND gate 221 within a predefined setup time after the clock signal CK transitions to the logic high level. FIG. 13B shows the normal operation mode of the flip flop 10a when the clock signal CK has the logic high level. More specifically, FIG. 13B illustrates a case that a second data signal D2 is applied to the AND gate 221 after the predefined setup time. Accordingly, the second data signal D2 may not be transferred to the final signal Q.

Referring to FIGS. 13A and 13B, when the scan enable signal SE has the logic low level, the flip flop 10a may operate in the normal operation mode. It is assumed that the clock signal CK transitions from the logic low level to the logic high level. For example, it is assumed in FIG. 13A that a first data signal D1 is applied to the master latch 200a when the clock signal CK has the logic low level, and assumed in FIG. 13B that a second data signal D2 is applied to the master latch 200a when the clock signal CK has the logic high level. For example, it is assumed that the second data signal D2 is applied to the master latch 200a after a setup time elapses from a time point when the clock signal CK transitions to the logic high level. Herein, the logic low level of the clock signal CK may be represented as 0, and the logic high level of the clock signal CK may be represented as 1.

Referring to FIG. 13A, when the clock signal CK has the logic low level, the first internal signal DCK may have the logic low level by the delay circuit 100a. The first internal signal DCK may be delayed by a delay time td from a time point at which the clock signal CK transitions, for example, from the first logic level to the second logic level.

Referring to FIG. 13A, when the clock signal CK has the logic low level, the second internal signal CKb may have the logic high level by the NAND gate 310a.

Because the first internal signal DCK has the logic low level, and the second internal signal CKb has the logic high level, the AOI31 logic circuit 220a may operate as an inverter, which receives the first data signal D1, and output the internal output signal Qm by inverting the first data signal D1. For example, while the first internal signal DCK is maintaining the logic low level, the master latch 200a may receive the first data signal D1 and output an inverted first data signal D1N as the internal output signal Qm.

Referring to FIG. 13A, when the clock signal CK has the logic low level, the second internal signal CKb has the logic high level, and thus, the OAI21 logic circuit 320 may operate as an inverter, which receives the inverted signal Qi. For example, when the clock signal CK has the logic low level, the slave latch 300a may maintain an existing (or, previous) final signal Q-.

In conclusion, when the clock signal CK has the logic low level, the master latch 200a may output the inverted first data signal D1N as the internal output signal Qm, and the slave latch 300a may maintain the existing final signal Q-.

Referring to FIG. 13B, when the clock signal CK has the logic high level, the second AOI21 logic circuit 120 may operate as an inverter, which receives the internal output signal Qm.

When the clock signal CK transitions to the logic high level, the internal output signal Qm is the same as the inverted first data signal D1N, and thus, the first internal signal DCK may be the same as the first data signal D1. According to an example embodiment of the inventive concept, a period of time for which the first internal signal DCK maintains the logic low level may be longer by a delay time than a period of time for which the clock signal CK maintains the logic low level. Therefore, although the clock signal CK transitions to the logic high level, the first internal signal DCK may have the logic low level for the delay time.

Referring to FIG. 13B, when the clock signal CK has the logic high level, the NAND gate 310a may operate as an inverter. When the clock signal CK transitions to the logic high level, the internal output signal Qm is the same as the inverted first data signal D1N, and thus, the second internal signal CKb may be the same as the first data signal D1 by the NAND gate 310a. Although the clock signal CK transitions to the logic high level, the first internal signal DCK maintains the logic low level for the delay time, and thus when a data signal applied to the AND gate 221 is changed within a predefined setup time, the internal output signal Qm may have the same value as an inverted value of the changed data signal.

The AOI31 logic circuit 220a may operate as a logic circuit including the AND gate 221, which receives the first data signal D1, and the second data signal D2 and the NOR gate 222, which receives an output value of the AND gate 221 and the first internal signal DCK. For example, the internal output signal Qm, which is an output value of the AOI31 logic circuit 220a, may be the inverted first data signal D1N as represented by Equation 1.

$$Qm=\overline{(D1D2+D1)}=D1N \qquad \text{[Equation 1]}$$

For example, when the clock signal CK has the logic high level, the master latch 200a may maintain the first data signal D1 as the internal output signal Qm.

Referring to FIG. 13B, when the clock signal CK has the logic high level, the OAI21 logic circuit 320 may operate as an inverter, which receives the second internal signal CKb. Therefore, the output signal QN may be the inverted first data signal D1N. The third inverter 340 receives the output signal QN and outputs an inverted value of the output signal QN as the final signal Q, and thus, the final signal Q may be the first data signal D1.

For example, when the clock signal CK has the logic high level, the slave latch 300a may output, as the final signal Q, the first data signal D1 input to the master latch 200a when the clock signal CK has the logic low level.

FIGS. 14A and 14B are circuit diagrams for describing the normal operation mode of the flip flop 10b according to an example embodiment of the inventive concept. For example, FIG. 14A shows the normal operation mode of the flip flop 10b when the clock signal CK has the logic low level. FIG. 14B shows the normal operation mode of the flip flop 10b when the clock signal CK has the logic high level. Although FIGS. 14A and 14B show the flip flop 10b of FIG. 10A, a description made with reference to FIGS. 14A and 14B may also be applied to the flip flops 10b-2 to 10b-5 of FIGS. 10B to 10E.

Referring to FIGS. 14A and 14B, when the scan enable signal SE has the logic low level, the flip flop 10b may operate in the normal operation mode. It is assumed that the clock signal CK transitions from the logic low level to the logic high level. It is assumed in FIG. 14A that the first data signal D1 is applied to the master latch 200b when the clock signal CK has the logic low level, and assumed in FIG. 14B that the second data signal D2 is applied to the master latch 200b when the clock signal CK has the logic high level.

Like the flip flop 10a of FIG. 13A, when the clock signal CK has the logic low level, the first internal signal DCK may have the logic low level, the internal output signal Qm may have the same logic level as the inverted first data signal D1N, the second internal signal CKb may have the logic high level, and the final signal Q may maintain a previous final signal Q-.

Like the flip flop 10a of FIG. 13B, when the clock signal CK has the logic high level, the first internal signal DCK may have the same logic level as the first data signal D1, the internal output signal Qm may have the same logic level as the inverted first data signal D1N, the second internal signal CKb may have the same logic level as the first data signal D1, and the final signal Q may have the same logic level as the first data signal D1.

Figure 15:
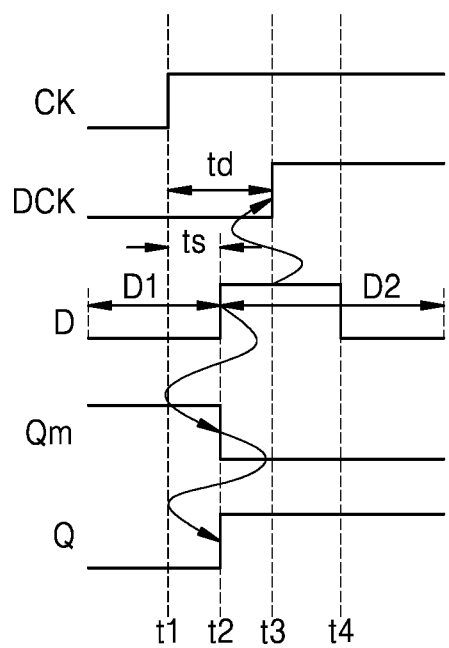
FIG. 15 is a timing diagram of a flip flop according to an example embodiment of the inventive concept.

FIG. 15 is a timing diagram of a flip flop according to an example embodiment of the inventive concept. The timing diagram of FIG. 15 may be used to describe an operation of at least one of the flip flops 10, 10-1, 10-2, 10-3, 10a, 10a-2, 10a-3, 10a-4, 10b, 10b-2, 10b-3, 10b-4, and 10b-5 described above with reference to FIGS. 1 to 3, 9A to 9C, and 10A to 10E, respectively. The clock signal CK may transition from the logic low level to the logic high level at a first time point t1. The first internal signal DCK may maintain the logic low level until a third time point t3 delayed by the delay time td from the first time point t1. For example, when the data signal D transitions from the logic low level to the logic high level at a second time point t2, the internal output signal Qm may be changed to the logic low level at the second time point t2 and the final signal Q may be changed to the logic high level at the second time point t2. For example, when the data signal D transitions from the logic high level to the logic low level at a fourth time point t4, the logic levels of the internal output signal Qm and the final signal Q may not be changed. The data signal D before the third time point t3 may be referred as the first data signal D1 of FIGS. 13A and 13B, and the data signal D after the third time point t3 may be referred as the second data signal D2 of FIGS. 13A and 13B. The delay time td may be, for example, a delay occurring when the clock signal CK transition to the logic high level the internal output signal Qm is passing through the delay circuit 100 of FIG. 1. Although the clock signal CK is described as an example, the timing diagram of FIG. 15 may also be applied to the buffered clock signal bCK of FIG. 9A by modifying a portion of the timing diagram of FIG. 15. Therefore, an operation of at least one of the flip flops 10a-2 shown in FIG. 9A may be described with reference to FIG. 15.

The data signal D may transition to the logic high level after a setup time ts elapses from the first time point t1. The setup time ts may be less than the delay time td according to an example embodiment of the inventive concept. The data signal D may be reflected on the internal output signal Qm when the first internal signal DCK maintains the logic low level. Therefore, even after the clock signal CK transitions to the logic high level, when the data signal D is changed within the setup time ts, the changed data signal D may be reflected on the final signal Q.

For example, referring to FIG. 15, when the data signal D is changed from the logic low level to the logic high level within the setup time ts from the first time point t1 at which the clock signal CK transitioned to the logic high level, the changed data signal D (i.e., "1") may be reflected on the internal output signal Qm and the final signal Q.

Figure 16:
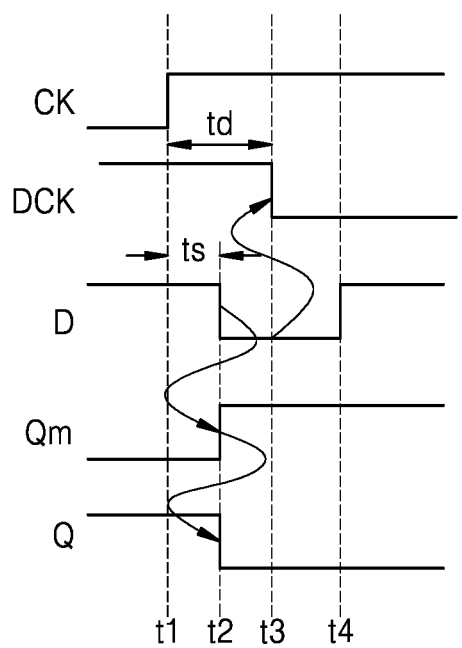
FIG. 16 is a timing diagram of a flip flop according to an example embodiment.

FIG. 16 is a timing diagram of a flip flop according to an example embodiment. The timing diagram of FIG. 16 may be used to describe an operation of at least one of the flip flops 10, 10-1, 10-2, 10-3, 10d, 10d-2, and 10d-3 described above with reference to FIGS. 1, 2, 11, 12A and 12B, respectively. The clock signal CK may transition from the logic low level to the logic high level at a first time point t1. The first internal signal DCK may maintain the logic high level until a third time point t3 delayed by the delay time td from the first time point t1. For example, when the data signal D transitions from the logic high level to the logic low level at a second time point t2, the internal output signal Qm may be changed to the logic high level at the second time point t2 and the final signal Q may be changed to the logic low level at the second time point t2. For example, when the data signal D transitions from the logic low level to the logic high level at a fourth time point t4, the logic levels of the internal output signal Qm and the final signal Q may not be changed. The setup time ts may be less than the delay time td. The data signal D may be reflected on the internal output signal Qm when the first internal signal DCK maintains the logic high level. Therefore, even after the clock signal CK transitions to the logic high level, when the data signal D is changed within the setup time ts, the changed data signal D (i.e., "0") may be reflected on the final signal Q.

Although the clock signal CK is described as an example, the timing diagram of FIG. 16 may also be applied to the inverted clock signal nCK of FIGS. 12A and 12B by modifying a portion of the timing diagram of FIG. 16. Therefore, an operation of at least one of the flip flops 10d, 10d-2, and 10d-3 shown in FIGS. 12A and 12B may be described with reference to FIG. 16.

In example embodiments, a flip flop according to an example embodiment of the inventive concept may include a delay circuit to perform a latching operation of the data signal D, which has a negative setup time. The less the setup time ts, the more a maximum frequency of the clock signal CK, and thus, a flip flop according to an example embodiment of the inventive concept may provide an improved clock frequency.

While the present disclosure of the inventive concept has been particularly shown and described with reference to example embodiments thereof, it will be understood that various changes in form and details may be made therein without departing from the spirit and scope of the following claims.

What is claimed is:

1. A flip flop comprising:
    a master latch comprising a delay circuit configured to receive a clock signal and generate a first internal signal, and the master latch configured to generate an internal output signal by latching a data signal based on the first internal signal; and
    a slave latch configured to generate a final signal by latching the internal output signal,
    wherein the delay circuit is further configured to:
    generate the first internal signal by delaying the clock signal by a delay time when the clock signal has a first logic level, and
    generate the first internal signal based on the data signal when the clock signal has a second logic level.

2. The flip flop of claim 1, wherein the slave latch comprises a logic circuit configured to:
generate a second internal signal based on the clock signal,
generate the second internal signal having the second logic level when the clock signal has the first logic level, and
generate the second internal signal having the same logic level as the data signal when the clock signal has the second logic level.

3. The flip flop of claim 2, wherein the master latch is configured to:
generate the internal output signal having an inverted logic level of a logic level of the data signal, for a period of time in which the clock signal has the first logic level and a period of time until a setup time elapses after the clock signal transitions to the second logic level, and
maintain a logic level of the internal output signal as a logic level determined based on the logic level of the data signal received before the setup time elapses, for a period of time after the setup time elapses, and
wherein the setup time is less than the delay time.

4. The flip flop of claim 3, wherein the slave latch is further configured to:
when the clock signal has the first logic level, maintain a logic level of the final signal as a logic level of the final signal before the clock signal transitions to the first logic level, and
output the final signal having an inverted logic level of a logic level of the internal output signal when the clock signal has the second logic level.

5. The flip flop of claim 4, wherein the delay circuit comprises:
a first logic circuit configured to receive a scan input signal, a scan enable signal, and the clock signal; and
a second logic circuit configured to receive the internal output signal, the clock signal, and an output signal of the first logic circuit and output the first internal signal.

6. The flip flop of claim 4, wherein the slave latch comprises a third logic circuit configured to receive the internal output signal and the clock signal and generate the second internal signal.

7. The flip flop of claim 6, wherein the delay circuit comprises:
a fourth logic circuit configured to receive a scan input signal and a scan enable signal and be enabled in response to the clock signal and the second internal signal; and
a fifth logic circuit configured to receive the clock signal, the second internal signal, and a signal of an internal node of the third logic circuit and output the first internal signal.

8. The flip flop of claim 7, wherein the third logic circuit comprises:
a first N-type transistor including a gate end of which receives the clock signal, a drain end of which is connected to a node at which the second internal signal is generated, and a source end of which is connected to the internal node; and
a second N-type transistor including a gate end of which receives the internal output signal, a drain end of which is connected to the internal node, and a source end of which is connected to a ground node.

9. A flip flop comprising:
a first latch configured to receive a data signal and a clock signal and output an internal output signal; and
a second latch configured to output a final signal by latching the internal output signal in response to the clock signal,
wherein the first latch comprises a delay circuit configured to generate a first internal signal of which a logic level is maintained for a delay time after the clock transitions, and
wherein the first latch is further configured to generate the internal output signal by latching the data signal in response to the first internal signal.

10. The flip flop of claim 9, wherein the delay circuit comprises a first logic circuit and a second logic circuit,
wherein the first logic circuit includes an AND gate configured to receive a scan enable signal and a scan input signal, and output a first signal by performing an AND operation on the scan enable signal and the scan input signal, and a NOR gate configured to receive the first signal and the clock signal, and output a second signal by performing a NOR operation on the first signal and the clock signal, and
wherein the second logic circuit includes an AND gate configured to receive the internal output signal and the clock signal, and output a third signal by performing an AND operation on the internal output signal and the clock signal, and a NOR gate configured to receive the second signal and the third signal, and output the first internal signal by performing a NOR operation on the third signal and the second signal.

11. The flip flop of claim 9, wherein the second latch comprises:
a third logic circuit configured to receive the internal output signal and the clock signal and output a second internal signal;
a fourth logic circuit configured to receive an inverted signal, the clock signal, and the second internal signal and output an inverted final signal;
a first inverter configured to receive the inverted final signal and output the inverted signal by inverting the inverted final signal; and
a second inverter configured to receive the inverted final signal and output the final signal by inverting the inverted final signal.

12. The flip flop of claim 11, wherein the first latch further comprises a fifth logic circuit configured to receive the second internal signal, the data signal, an inverted scan enable signal, and the first internal signal, and output an internal output signal.

13. The flip flop of claim 11, wherein the third logic circuit comprises:
a sixth logic circuit including an AND gate configured to receive the clock signal and the internal output signal and output a fourth signal by performing an AND operation on the clock signal and the internal output signal; and
a seventh logic circuit including a NOR gate configured to receive a reset signal and the fourth signal by performing a NOR operation on the reset signal and the fourth signal, and output the second internal signal.

14. The flip flop of claim 9, wherein the second latch comprises an eighth logic circuit configured to receive the internal output signal and the clock signal and output a second internal signal.

15. The flip flop of claim 14, wherein the eighth logic circuit comprises:
a ninth P-type transistor including a gate end of which receives the internal output signal, a first end of which is connected to a power supply node, and a second end of which is connected to a fifth node;

a tenth P-type transistor including a gate end of which receives the clock signal, a first end of which is connected to the power supply node, and a second end of which is connected to the fifth node;

an eighth N-type transistor including a gate end of which receives the clock signal, a first end of which is connected to the fifth node, and a second end of which is connected to a sixth node; and a ninth N-type transistor including a gate end of which receives the internal output signal, a first end of which is connected to the sixth node, and a second end of which is connected to a ground node.

16. The flip flop of claim 15, wherein the delay circuit comprises a circuit part connected to the sixth node and configured to operate as an inverter which receives the data signal from the sixth node as an input when the clock signal has a logic high level.

17. The flip flop of claim 16, wherein the delay circuit further comprises a ninth logic circuit configured to receive a scan enable signal and a scan input signal, which is enabled in response to the clock signal, and including an output end of which is connected to a seventh node, and the circuit part comprises:
an eleventh P-type transistor including a gate end of which receives the second internal signal, a first end of which is connected to the power supply node, and a second end of which is connected to the seventh node;
a tenth N-type transistor including a gate end of which receives the clock signal;
an eleventh N-type transistor including a gate end of which is connected to the sixth node; and
a tenth logic circuit including an input end of which is connected to the seventh node, and which generates the first internal signal by inverting a signal of the seventh node,
wherein the tenth N-type transistor and the eleventh N-type transistor are connected in series to form a third series structure including a first end of which is connected to the ground node, and a second end of which is connected to the seventh node.

18. The flip flop of claim 17, further comprising:
a twelfth P-type transistor including a gate end of which receives the internal output signal, a first end of which is connected to the power supply node, and a second end of which is connected to the sixth node.

19. The flip flop of claim 14, wherein the eighth logic circuit comprises:

a ninth P-type transistor including a gate end of which receives the internal output signal, a first end connected to an eighth node, and a second end of which is connected to a fifth node;

a tenth P-type transistor including a gate end of which receives the clock signal, a first end connected to the eighth node, and a second end of which is connected to the fifth node;

a thirteenth P-type transistor including a gate end of which receives a reset signal, a first end of which is connected to a power supply node, and a second end of which is connected to the eighth node;

an eighth N-type transistor including a gate end of which receives the clock signal, a first end of which is connected to the fifth node, and a second end of which is connected to a sixth node;

a ninth N-type transistor including a gate end of which receives the internal output signal, a first end of which is connected to the sixth node, and a second end of which is connected to a ground node; and a twelfth N-type transistor including a gate end of which receives the reset signal, a first end of which is connected to the ground node, and a second end of which is connected to the fifth node.

20. A flip flop comprising:
a first OR-AND-inverter (OAI)21 logic circuit configured to receive a scan input signal, an inverted scan enable signal, and an inverted clock signal and output an intermediate signal;
a second OAI21 logic circuit configured to receive an internal output signal, the inverted clock signal, and the intermediate signal and output a first internal signal;
an OAI31 logic circuit configured to receive a second internal signal, a scan enable signal, a data signal, and the first internal signal and output the internal output signal;
a NOR2 logic circuit configured to receive the inverted clock signal and the internal output signal and output the second internal signal;
an AND-OR-inverter (AOI)21 logic circuit configured to receive an inverted signal, the inverted clock signal, and the second internal signal and output an inverted final signal;
a first inverter configured to output the inverted signal by inverting the inverted final signal; and
a second inverter configured to output a final signal by inverting the inverted final signal.

* * * * *